(12) United States Patent
Zi et al.

(10) Patent No.: US 12,550,685 B2
(45) Date of Patent: *Feb. 10, 2026

(54) PROTECTIVE COMPOSITION AND METHOD OF FORMING PHOTORESIST PATTERN

(71) Applicant: TAIWAN SEMICONDUCTOR MANUFACTURING COMPANY, LTD., Hsinchu (TW)

(72) Inventors: An-Ren Zi, Hsinchu (TW); Ching-Yu Chang, Yilang County (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/120,978

(22) Filed: Mar. 13, 2023

(65) Prior Publication Data

US 2023/0268178 A1    Aug. 24, 2023

Related U.S. Application Data

(63) Continuation of application No. 16/655,089, filed on Oct. 16, 2019, now Pat. No. 11,605,538.

(60) Provisional application No. 62/753,902, filed on Oct. 31, 2018.

(51) Int. Cl.
*G03F 7/038* (2006.01)
*G03F 1/22* (2012.01)
*H01L 21/027* (2006.01)

(52) U.S. Cl.
CPC ............ *H01L 21/0274* (2013.01); *G03F 1/22* (2013.01); *G03F 7/038* (2013.01)

(58) Field of Classification Search
CPC ............. G03F 7/11; G03F 7/038; G03F 7/039
See application file for complete search history.

(56) References Cited

U.S. PATENT DOCUMENTS

| | | | |
|---|---|---|---|
| 7,384,730 B2 | 6/2008 | Hata et al. | |
| 8,796,666 B1 | 8/2014 | Huang et al. | |
| 8,846,303 B2 | 9/2014 | Hatakeyama et al. | |
| 8,969,483 B2 | 3/2015 | Maeda et al. | |
| 9,093,530 B2 | 7/2015 | Huang et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 9,711,367 B1 | 7/2017 | Chien et al. | |
| 9,857,684 B2 | 1/2018 | Lin et al. | |
| 9,859,206 B2 | 1/2018 | Yu et al. | |
| 9,875,892 B2 | 1/2018 | Chang et al. | |
| 10,073,347 B1* | 9/2018 | Zi ..................... H01L 21/6715 | |
| 10,114,286 B2 | 10/2018 | Wu et al. | |
| 11,605,538 B2* | 3/2023 | Zi ........................ G03F 7/0042 | |
| 2007/0037089 A1 | 2/2007 | Chang | |
| 2013/0089820 A1 | 4/2013 | Hatakeyama et al. | |
| 2015/0160552 A1* | 6/2015 | Lai .......................... G03F 7/325 | |
| | | | 430/319 |
| 2015/0261087 A1* | 9/2015 | Chen ..................... G03F 7/0045 | |
| | | | 438/514 |
| 2016/0202610 A1 | 7/2016 | Lee et al. | |
| 2017/0101521 A1 | 4/2017 | Koyama | |
| 2017/0227852 A1* | 8/2017 | Zi ........................ G03F 7/0382 | |
| 2018/0046086 A1* | 2/2018 | Waller ................ H01L 21/0273 | |

FOREIGN PATENT DOCUMENTS

| | | |
|---|---|---|
| KR | 10-2013-0039299 A | 4/2013 |
| KR | 20130039299 A | 4/2013 |
| KR | 10-2015-0131940 A | 11/2015 |
| TW | 201312278 A | 3/2013 |
| TW | 201612643 A | 4/2016 |

OTHER PUBLICATIONS

A. Soyano, "Application of Polymers to photoresist materials," Nippon Gomu Kyokaishi, No. 2, pp. 33-39 (2012).

(Continued)

*Primary Examiner* — Daborah Chacko-Davis
(74) *Attorney, Agent, or Firm* — STUDEBAKER BRACKETT PLLC

(57) ABSTRACT

A method includes forming a protective layer over a substrate edge and a photoresist over a substrate. Protective layer removed and photoresist exposed to radiation. Protective layer made of composition including acid generator and polymer having pendant acid-labile groups. Pendant acid-labile groups include polar functional groups; acid-labile groups including polar switch functional groups; acid-labile groups, wherein greater than 5% of pendant acid-labile groups have structure

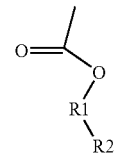

wherein R1 is C6-C30 alkyl group, cycloalkyl group, hydroxylalkyl group, alkoxy group, alkoxyl alkyl group, acetyl group, acetylalkyl group, carboxyl group, alkyl carboxyl group, cycloalkyl carboxyl group, saturated or unsaturated hydrocarbon ring, or heterocyclic group; and R2 is C4-C9 alkyl group, cycloalkyl group, hydroxylalkyl group, alkoxy group, alkoxyl alkyl group, acetyl group, acetylalkyl group, carboxyl group, alkyl carboxyl group, or cycloalkyl carboxyl group; polymer having pendant acid-labile groups and lactone pendant groups; or polymer having pendant acid-labile groups and carboxylic acid groups.

20 Claims, 16 Drawing Sheets

(56) References Cited

OTHER PUBLICATIONS

C. L. Henderson Group, Introduction to Chemically Amplified Photoresists, Retrieved Sep. 27, 2019, from https://sites.google.com/site/hendersonresearchgroup/helpful-primers-introductions/introduction-to-chemically-amplified-photoresists.
Willson Research Group—Water Soluble Resist, Aqueous Processable Positive and Negative tone Photoresists, Retrieved Sep. 27, 2019, from https://willson.cn.utexas.edu/Research/Sub_Files/Water_Soluble/index.htm.
Non-Final Office Action issued in U.S. Appl. No. 16/655,089, dated Nov. 15, 2021.
Final Office Action issued in U.S. Appl. No. 16/655,089, dated Apr. 5, 2022.
Non-Final Office issued in U.S. Appl. No. 16/655,089, dated Jul. 21, 2022.
Notice of Allowance issued in U.S. Appl. No. 16/655,089, dated Nov. 7, 2022.

\* cited by examiner

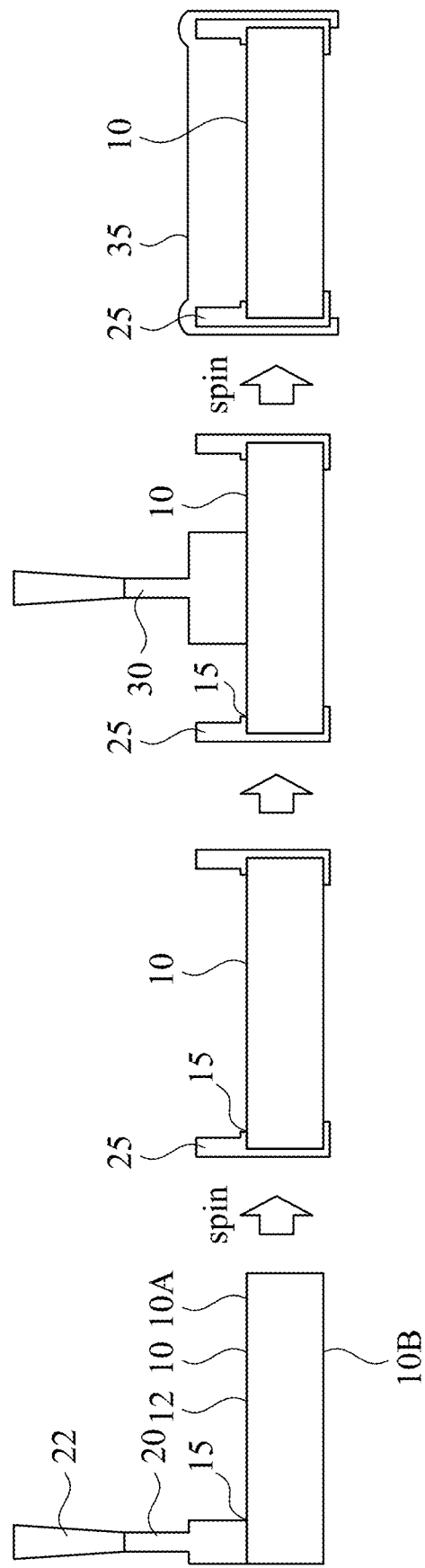

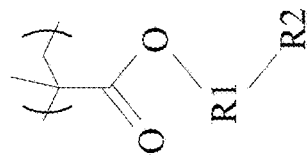
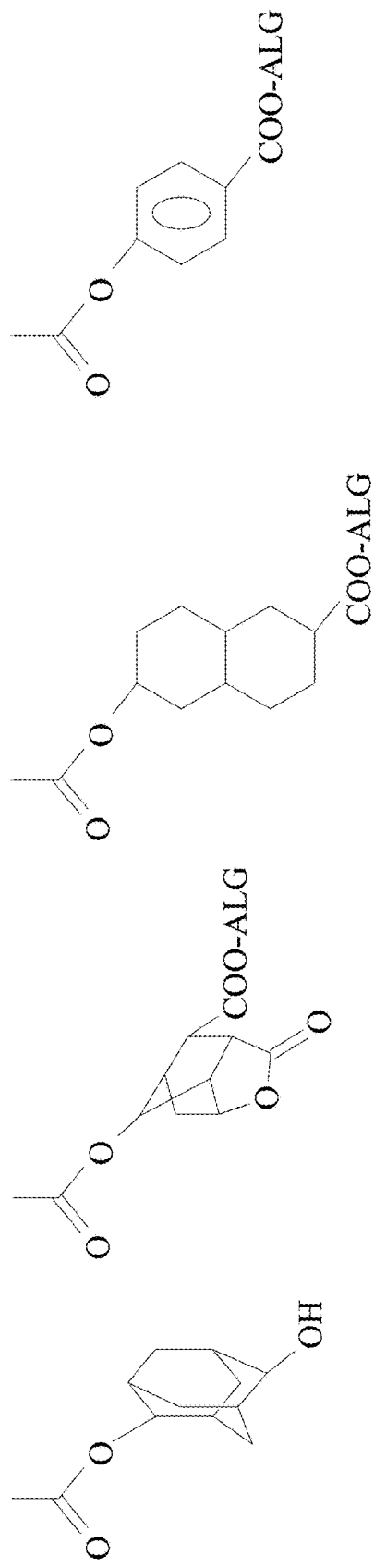
Examples:
FIG. 16

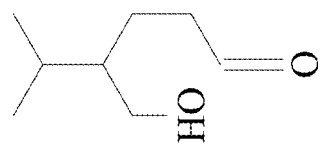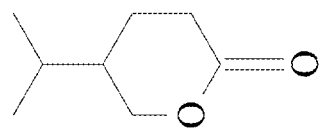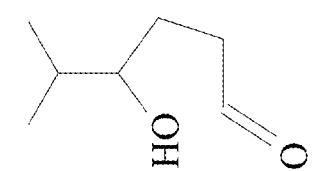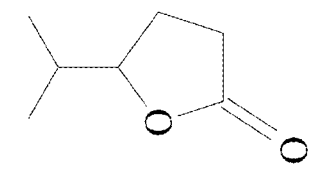
FIG. 17

PROTECTIVE COMPOSITION AND METHOD OF FORMING PHOTORESIST PATTERN

CROSS-REFERENCE TO RELATED APPLICATIONS

This application is a continuation application of U.S. application Ser. No. 16/655,089, now U.S. Pat. No. 11,605,538, filed Oct. 16, 2019, which claims priority to U.S. Provisional Patent Application No. 62/753,902 filed Oct. 31, 2018, the entire disclosures of each of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example, advanced lithography patterning technologies are implemented to form various patterns, such as gate electrodes and metal lines, on semiconductor wafers. Lithography patterning technologies include coating a resist material on the surface of a semiconductor wafer.

The existing resist coating method, such as spin coating, forms the resist material on all regions of a wafer including edges of the wafer, even to the backside surface of the wafer. The resist material on the edges and the backside surface of the wafer during the coating process and subsequent processes (such as developing) leads to various contamination-related problems and concerns, such as contaminating the coater chuck or the track. Accumulation of the resist material on the edges of the wafer will disturb patterning stability on the wafer edge and causes erroneous leveling readings during the lithography process. For examples, the presence of the resist material on the bevel and backside not only increases the probability of high hotspot but also has the potential to contaminate subsequent processing tools. In other examples, existing coating process has high resist residual at wafer edges and bevel, which may induce resist peeling and result in poor yield. Various methods are used or proposed to address the issues, such as edge bead rinse, backside rinse and additional coating. However, the undesired hump was created by edge bead rinse and backside rinse, which is potential defect source in the following processes. In other cases, the additional coating further introduces contaminations to wafers and lithography system, or has additional efficiency and effectiveness concerns to manufacturing throughput. Accordingly, it may be desirable to provide a system and a method of utilizing thereof absent the disadvantages discussed above.

Extreme ultraviolet lithography (EUVL) has been developed to form smaller semiconductor device feature size and increase device density on a semiconductor wafer. Because metals have high EUV absorbance, metal-containing photoresists have been developed to provide improved EUVL. Metal absorption from the metal-containing photoresists in the underlying substrate can contaminate the underlying substrate. An efficient technique to prevent metal contamination of semiconductor devices is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 shows a process stage of a sequential operation according to an embodiment of the disclosure.

FIG. 2 shows a process stage of a sequential operation according to an embodiment of the disclosure.

FIG. 3 shows a process stage of a sequential operation according to an embodiment of the disclosure.

FIG. 4 shows a process stage of a sequential operation according to an embodiment of the disclosure.

FIG. 16 shows polymer compositions according to embodiments of the disclosure.

FIG. 17 shows polymer resins according to embodiments of the disclosure.

DETAILED DESCRIPTION

Figure 5:
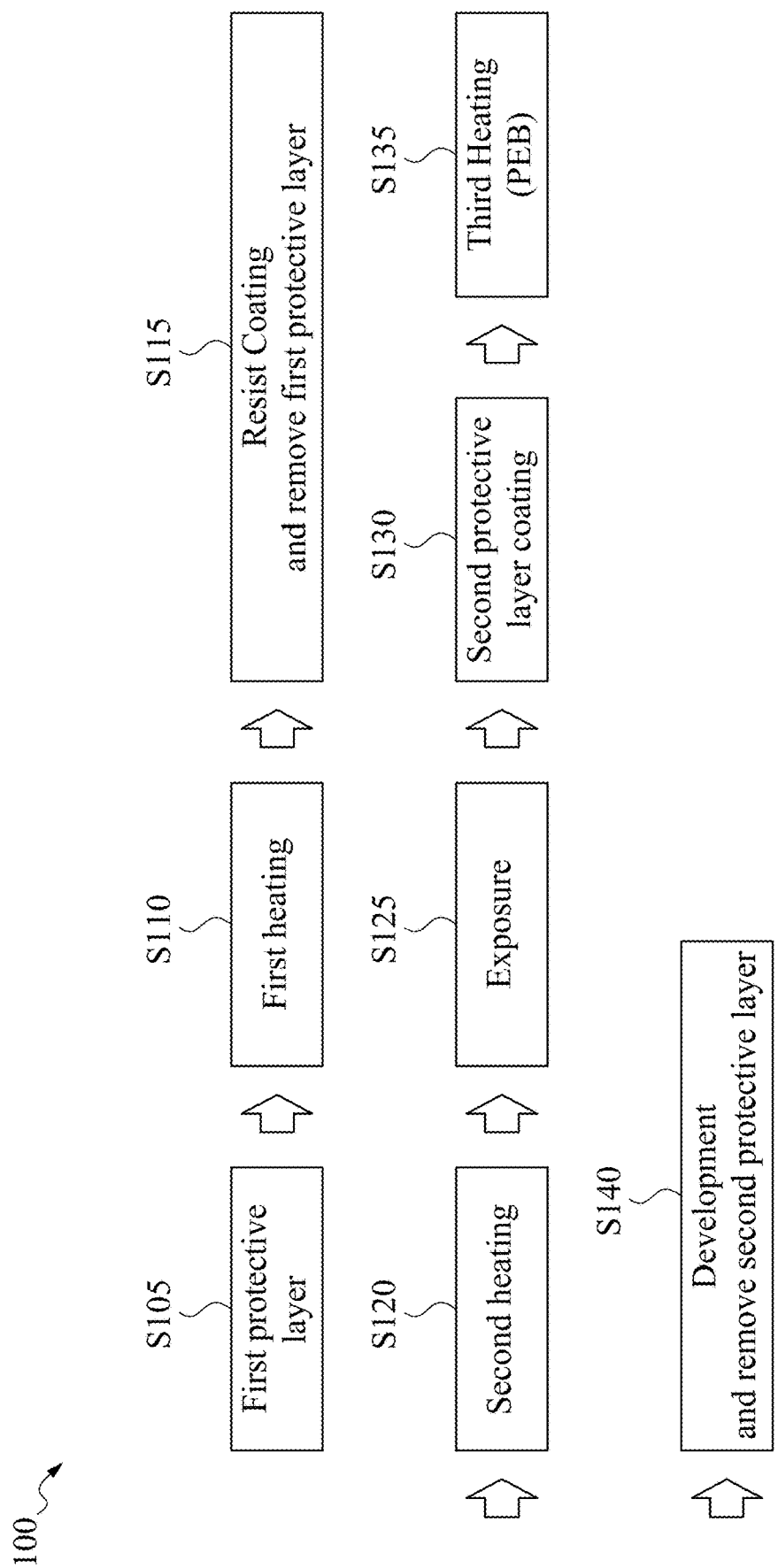
FIG. 5 illustrates a process flow according to embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Photoresists containing metals in the form of metal oxides are used in extreme ultraviolet photoresists because metals have high absorption of extreme ultraviolet radiation. The metals, however, can contaminate semiconductor substrates. The contamination is particularly an issue at the beveled edges of wafers. To prevent contamination, a protective composition layer is formed on the bevel around the periphery of the substrates or wafers. FIG. 1 shows a protective layer composition 20 being dispensed on the periphery 15 of a substrate 10, such as a wafer. The wafer 10 is rotated (spinned) during or after the protective wafer composition 20 is applied, thereby forming a protective layer 25 around the periphery 15 of the wafer, as shown in FIG. 2.

A photoresist 30 is subsequently dispensed on the substrate 10 to form a photoresist layer 35, as shown in FIG. 3, and the substrate 10 is rotated (spinned) during or after the photoresist layer 30 is deposited, spreading the photoresist across the substrate surface and down the sides of the substrate, as shown in FIG. 4. As shown in FIG. 4, the protective layer 25 protects the wafer edges 15 from contamination by the photoresist layer 35.

Conventional protective compositions undergo as much as 30% film loss and become porous during subsequent photolithographic operations. The high amount film loss and void formation could provide paths for metals in the photoresist to contaminate the substrate or wafer edges. The film loss and void formation is believed to be caused by the departure of acid-labile groups from the protective layer during photolithographic operations.

Embodiments of the present disclosure provide a composition and method in which the acid-labile group on the polymer resin in the protective layer remains in the protective layer, even though it is cleaved from the polymer during photolithographic processing.

The protective layer composition according to embodiments of the disclosure includes a polymer chain which includes a pendant acid-labile group (ALG). The polymer contains about 20 wt. % to about 70 wt. % of the pendant acid-labile group based on the total weight of the polymer.

Embodiments of the present disclosure include five embodiments of polymer resins with pendant acid-labile groups. The first embodiment is a polymer with ALGs including one or more polar functional groups. The second embodiment is a polymer with ALGs including a polar switch functional group. The third embodiment is a polymer with ALGs including a bulky or rigid group connecting the ALGs to the main polymer chain. The fourth embodiment is a polymer including ALGs and ring opening pendant lactone groups. The fifth embodiment is a polymer containing carboxylic acid pendant groups in addition to the ALGs.

In some embodiments, after forming the protective layer, a heating or baking operation is performed. During the heating operation, the polymer is reacted with an acid or a base, generated by an acid generator or base generator in the protective layer composition. In some embodiments, the acid generator is a thermal acid generator (TAG) or thermal base generator (TBG). The acid or base generated during the heating process cleaves the ALG groups. However, the ALG groups remain in the protective layer composition, thereby reducing protective layer shrinking and void formation compared to conventional protective layer compositions. In embodiments of the disclosure, the bevel contamination after photolithographic processing is less than $1\times10^{11}$ atom/$cm^2$ in contrast to $1\times10^{12}$ to $1\times10^{14}$ atom/$cm^2$ in wafers not using the composition and methods of the present disclosure.

Figure 6:
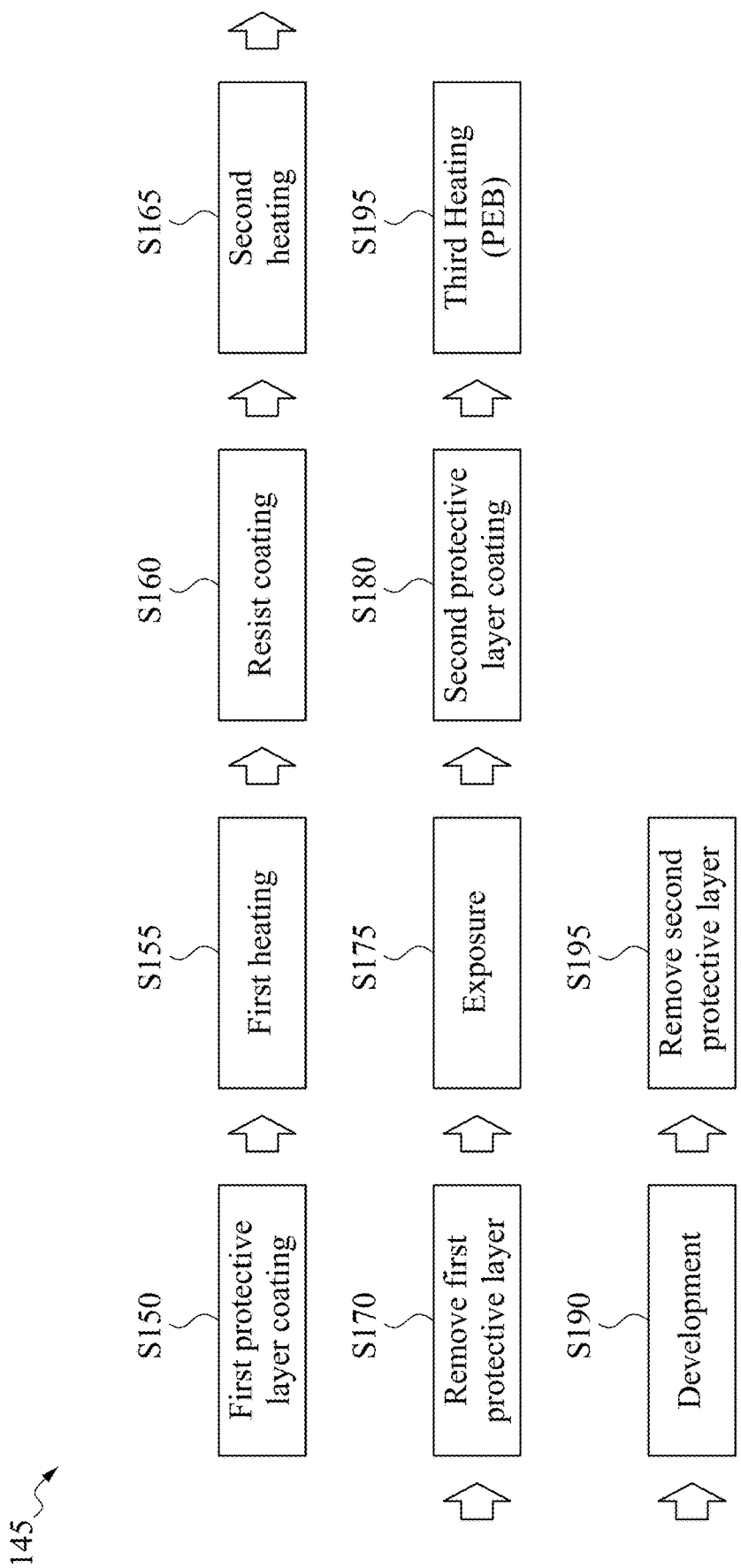
FIG. 6 illustrates a process flow according to embodiments of the disclosure.

FIGS. 5 and 6 illustrate process flows according to embodiments of the disclosure. The method 100 includes an operation S105 of forming a first protective layer on an edge portion 15 of the wafer 10 (see FIG. 1). In the present embodiment, the wafer 10 is a semiconductor wafer, such as a silicon wafer. In some embodiments, the wafer 200 includes other elementary semiconductor (such as germanium); a compound semiconductor (such as silicon germanium, silicon carbide, gallium arsenic, gallium phosphide, indium phosphide, indium arsenide, and/or indium antimonide); or combinations thereof. In furtherance of the embodiments, those semiconductor material films are epitaxially grown on the silicon wafer.

The wafer 10 has a front surface 10A and a backside surface 10B opposing each other, as shown in FIG. 1. One or more integrated circuits are formed, partially formed or to-be formed on the front surface 10A of the wafer 10. Therefore, the front surface 10A of the wafer 10 includes a patterned material layer or a material layer to be patterned. For example, the front surface 10A may include various isolation features (such as shallow trench isolation features), various doped features (such as doped wells, or doped source and drain features), various devices (such as transistors, diodes, imaging sensors, or resistors), various conductive features (such as contacts, metal lines and/or vias of an interconnection structure), packaging material layers (such as bonding pads and/or a passivation layer), or a combination thereof. On a completely fabricated semiconductor wafer, all above material layers and patterns may be present on the front surface 10A of the semiconductor wafer 10.

The wafer 10, such as a top material layer on the wafer or a silicon substrate of the wafer, is to be patterned through a photolithography process. The wafer 10 includes a circuit region 12 and edge portion 15 surrounding the circuit region 12, as shown in FIG. 1. The circuit region 12 is a region of the wafer 10 within which the integrated circuits are formed on the front surface 10A of the wafer. The circuit region 12 includes multiple integrated circuits that will be cut to form multiple integrated circuit chips at the backend of the fabrication in some embodiments. The circuit region 12 also includes scribing lines between the integrated circuit chips in some embodiments. Various test patterns may be formed in the scribing lines for various testing, monitoring and fabrication purposes. The edge portion 15 of the wafer 10 is a region without a circuit and is not patterned during the fabrication. The edge portion 15 includes the portion at the edge of the front surface 10A, and may further include the bevel surface and the edge portion of the backside surface 10B of the wafer. In the operation 105, the edge portion 15 is coated with a protective layer (or first protective layer) 25, as illustrated in FIG. 3, that constrains the edge portion 15 from direct deposition and formation of resist material thereon. The coating of the edge portion 15 of the wafer 10 is implemented through a suitable mechanism in accordance with various embodiments.

The edge portion 15 is selectively coated to form a protective layer 20 on the edge portion 15 of the wafer 10. The protective layer 20 is formed to prevent contamination or defects by the resist layer coated on the edge portion of the wafer. Defects include peeling and leveling. Contamination includes metal contamination from the metal-containing photoresists used in an EUV lithography process. In some embodiments, the selective coating process includes dispensing the protective layer coating 20 from a dispenser 22 to form the protective layer 25 on the edge portion 15 of the wafer 10. In some embodiments, the protective layer 25 has a thickness ranging from 50 nm to about 100 nm, and a width of about 1 mm to about 5 mm along the edge of the wafer 10.

In operation S110 heating (or curing) of the protective layer 20 is performed to cure the protective layer 20 in some embodiments. In some embodiments, the curing process is a thermal cure in which a thermal acid generator (TAG) or thermal base generator (TBG) is heated to temperature high enough to trigger the TAG to release acid or the TBG to release base. In this consideration, the TAG or TBG is selected such that temperature to release the acid or base is close to the temperature $T_{PEB}$ of a subsequent post-exposure baking, such as $T_{PEB}$+/−20° C. In some embodiments, the first heating temperature is in a range of about 100° C. to about 200° C. for about 10 seconds to about 10 minutes. In some embodiments, the protective layer is heated for a about 30 seconds to about 5 minutes. In some embodiments, the first heating temperature is in a range between about 130° C. and 170° C., and for a duration of about 60 seconds. In other embodiments, the thermal curing process is carried out at a temperature between about 40° C. and about 120° C. for about 10 seconds to about 10 minutes.

Figure 7B:
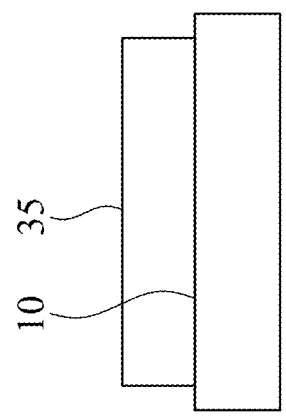
FIGS. 7A and 7B show process stages of a sequential operation according to embodiments of the disclosure.
Figure 7A:
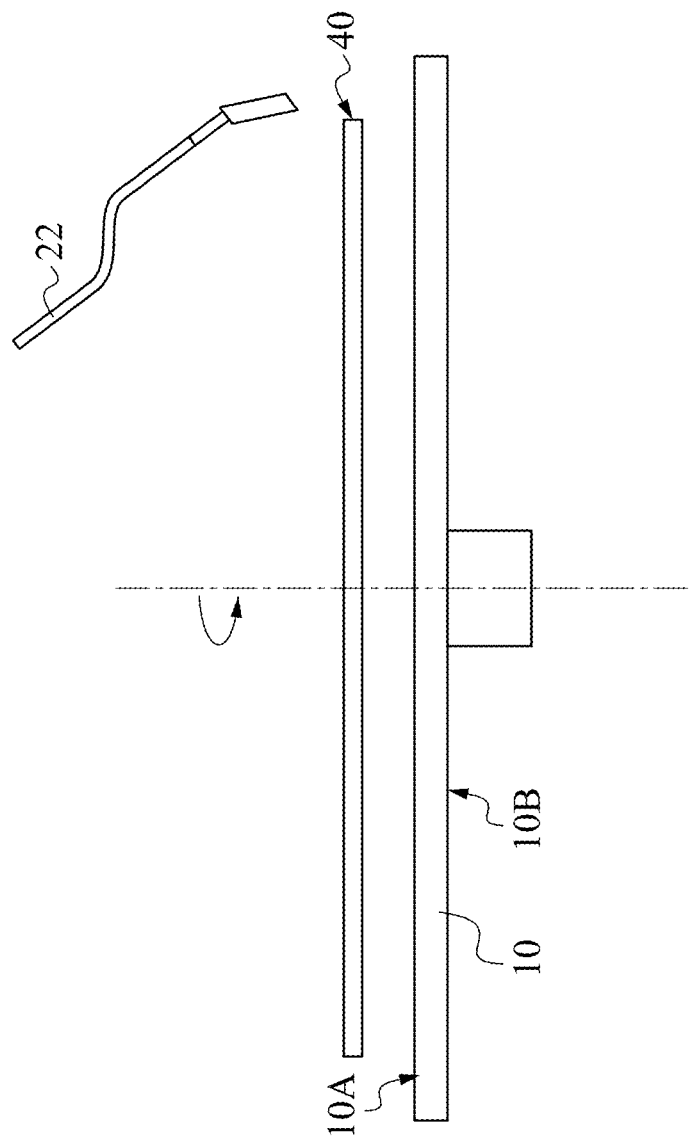

In some embodiments, a selective coating mechanism includes a blocker 40 having a special design, as illustrated in FIG. 7A. The blocker 40 is designed with a shape, a size, and a configuration to prevent the circuit region 12 of the wafer 10 from being coated by the protective layer composition. For example, the blocker 40 includes a round shape with the size matching to and covering the circuit region 12 of the wafer 10. In some embodiments, the blocker 40 includes sidewalls extending downward towards the wafer 10, to prevent protective layer coating 20 from getting on the circuit region 12 of the wafer 10.

After the formation of the protective layer 25 on the edge portion 15 of the wafer 10, the method 100 proceeds to an operation S115 of forming a photoresist layer 30 on the front surface 10A of the wafer 10, as illustrated in FIGS. 3 and 4. A photoresist composition 30 is coated on the front surface 10A of the wafer 10 in the circuit region 12 while the photoresist composition 30 is constrained from the edge portion 15. In some embodiments, the photoresist layer 35 spreads over the protective layer 25, as illustrated in FIG. 4. In some embodiments, the protective layer 25 has a thickness of about 0.5 times to 3 times the thickness of the resist layer 35.

After forming the photoresist layer 35, the protective layer 25 is removed in some embodiments. The protective layer 25 is removed by using a removing solution that removes the protecting layer 25. In some embodiments, the removing solution is a mixture of propylene glycol methyl ether (PGME) and propylene glycol methyl ether acetate (PGMEA). In some embodiments, the removing solution includes 70% PGME and 30% PGMEA, also referred to as OK73. The removing is selective to the protective layer 25 and does not remove the photoresist layer 35 in some embodiments, and any remaining photoresist that was overhanging the protective layer is subsequently removed by a suitable solvent, as shown in FIG. 7B. The protective layer 25 is removed prior to applying a radiation exposure to the photoresist layer 35 to prevent the protective layer 25 from introducing contamination to the photolithography apparatus.

In some embodiments, a cleaning solution is applied to the wafer 10 to remove contaminants, such as metals from the metal-containing photoresist. The cleaning solution is applied to a backside 10B of the wafer and/or the side edges of the wafer. The wafer is cleaned because the wafer transferring process (e.g., as the wafer 10 is transferred from one semiconductor fabrication tool to another semiconductor fabrication tool) may involve physical contact with the backside or the side edges of the wafer 10. For example, as the wafer 10 is transferred out of a semiconductor fabrication tool (an EUV lithography apparatus in an embodiment), various components of the semiconductor fabrication tool may come into contact with the bottom (e.g., backside 10B) or side portions of the wafer 10. Through such contact, the metals may be left on the semiconductor fabrication tool. If a subsequent process performed by that semiconductor fabrication tool is supposed to be metal-free, then the metals may be a contaminant. To enhance the effectiveness of the cleaning, the front surface 10A of the wafer 10 may be optionally cleaned as well.

In some embodiments, a second heating (pre-exposure bake) is performed at operation S120 to dry the photoresist layer 35 prior to exposing the photoresist layer 35 to radiation. In some embodiments, the photoresist layer 35 is heated at a temperature between about 40° C. and about 120° C. for about 10 seconds to about 10 minutes.

Figure 8:
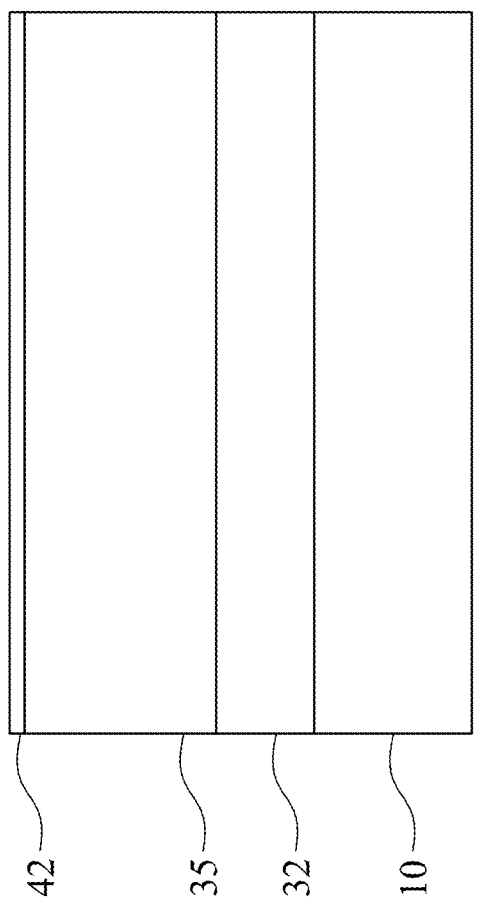
FIG. 8 shows a process stage of a sequential operation according to an embodiment of the disclosure.

FIG. 8 illustrates a portion of a photoresist-coated substrate 10, such as a wafer. To simplify the explanation of the processing, the central portion of the wafer is illustrated excluding the edge portions 15 of the wafer in FIGS. 8-9B, 12, and 13. FIG. 8 illustrates a semiconductor substrate 10 with a layer to be patterned 32 disposed thereon. In some embodiments, the layer to be patterned 32 is a hard mask layer; metallization layer; or a dielectric layer, such as a passivation layer, disposed over a metallization layer. In embodiments where the layer to be patterned 32 is a metallization layer, the layer to be patterned 32 is formed of a conductive material using metallization processes, and metal deposition techniques, including chemical vapor deposition, atomic layer deposition, and physical vapor deposition (sputtering). Likewise, if the layer to be patterned 32 is a dielectric layer, the layer to be patterned 32 is formed by dielectric layer formation techniques, including thermal oxidation, chemical vapor deposition, atomic layer deposition, and physical vapor deposition. A photoresist layer 35 is disposed over the layer to be patterned. In some embodiments, an optional protective upper layer 42, such as polysiloxane layer, is disposed over the photoresist layer 35. In some embodiments, the thickness of the optional upper layer 42 is sufficiently thin so that the upper layer 42 does not adversely affect the subsequent exposure of the photoresist layer 35 to radiation.

Figure 9A:
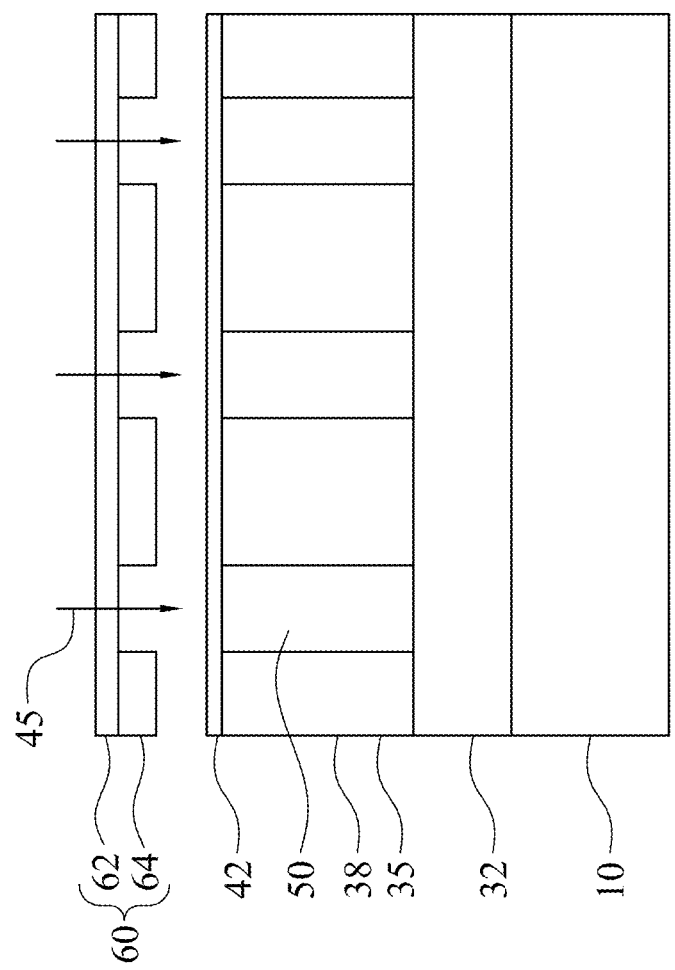
FIGS. 9A and 9B show process stages of a sequential operation according to embodiments of the disclosure.
Figure 9B:
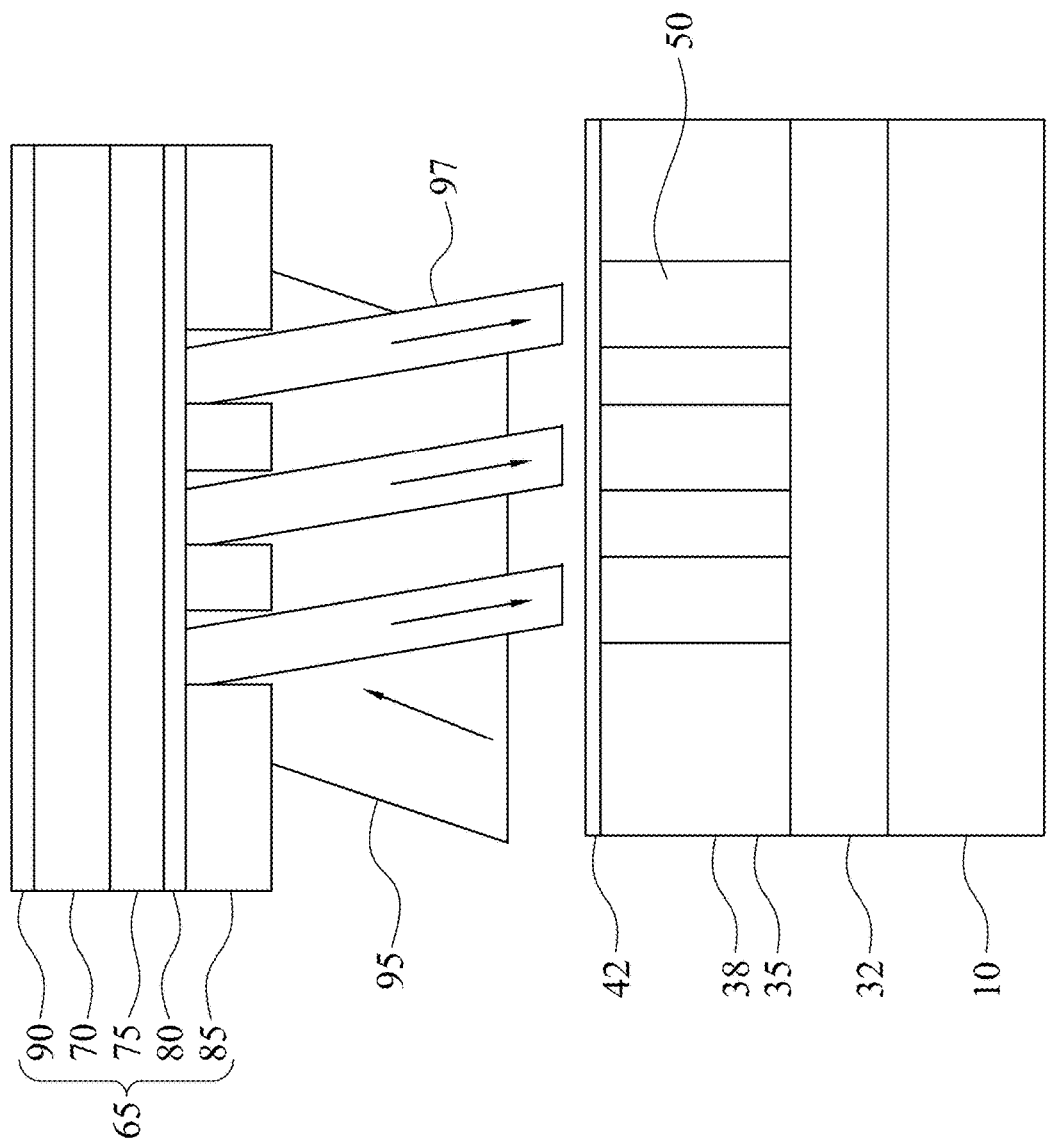

FIGS. 9A and 9B illustrate selective exposures of the photoresist layer 35 to form an exposed region 50 and an unexposed region 38. In some embodiments, the exposure to radiation is carried out by placing the photoresist-coated substrate in a photolithography tool. The photolithography tool includes a photomask 60/65, optics, an exposure radiation source to provide the radiation 45/97 for exposure, and a movable stage for supporting and moving the substrate under the exposure radiation.

In some embodiments, the radiation source (not shown) supplies radiation 45/97, such as ultraviolet light, to the photoresist layer 35 in order to induce a reaction of the photoactive compounds in the photoresist, which in turn reacts with the polymer resin in the photoresist to chemically alter those regions of the photoresist layer 35 to which the radiation 45/97 impinges. The photoresists used in embodiments of the disclosure will be subsequently discussed in further detail in this disclosure. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45/97 is patterned by the photomask 60/65. In some embodiments, the optics include one or more lenses, mirrors, filters, and combinations thereof to control the radiation 45/97 along its path.

In an embodiment, the patterned radiation 45/97 is extreme ultraviolet light having a 13.5 nm wavelength, the photoactive compound (PAC) is a photoacid generator, the group to be decomposed is a carboxylic acid group pendant to the hydrocarbon main chain structure of the polymer. In some embodiments, a cross linking agent is used. The patterned radiation 45/97 impinges upon the photoacid generator and the photoacid generator absorbs the impinging patterned radiation 45/97. This absorption initiates the photoacid generator to generate a proton (e.g., a $H^+$ atom) within the photoresist layer 35. When the proton impacts the carboxylic acid group on the hydrocarbon structure, the proton reacts with the carboxylic acid group, chemically altering the carboxylic acid group and altering the properties of the polymer resin in general. The carboxylic acid group then reacts with the cross-linking agent in some embodiments to cross-link with other polymer resins within the exposed region of the photoresist layer 35.

In some embodiments, the exposure of the photoresist layer 35 uses an immersion lithography technique. In such a technique, an immersion medium (not shown) is placed between the final optics and the photoresist layer, and the exposure radiation 45 passes through the immersion medium.

As shown in FIG. 9A, the exposure radiation 45 passes through a photomask 60 before irradiating the photoresist layer 35 in some embodiments. In some embodiments, the photomask has a pattern to be replicated in the photoresist layer 35. The pattern is formed by an opaque pattern 64 on the photomask substrate 62, in some embodiments. The opaque pattern 64 may be formed by a material opaque to ultraviolet radiation, such as chromium, while the photomask substrate 62 is formed of a material that is transparent to ultraviolet radiation, such as fused quartz.

In some embodiments, the selective exposure of the photoresist layer 35 to form exposed regions 50 and unexposed regions 38 is performed using extreme ultraviolet lithography. In an extreme ultraviolet lithography operation a reflective photomask 65 is used to form the patterned exposure light, as shown in FIG. 9B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the backside of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 65 and the photoresist-coated substrate.

After the operation S125, a latent pattern is formed in the resist layer 35. The latent pattern of the photoresist layer refers to the exposed pattern in the photoresist layer 35, which eventually becomes a physical resist pattern, such as by a developing operation. The latent pattern of the resist layer 35 includes unexposed portions 38 and exposed portions 50. In an embodiment using a chemically amplified (CA) resist material with a PAG, acids are generated in the exposed portions 50 during the exposure process. In the latent pattern, the exposed portions 50 of the resist layer 35 are physically or chemically changed. In some examples, the exposed portions 50 are de-protected, inducing polarity change for dual-tone imaging (developing). In other examples, the exposed portions 50 are changed in polymerization, such as depolymerized as in positive tone resist or cross-linked as in negative tone resist.

Figure 10:
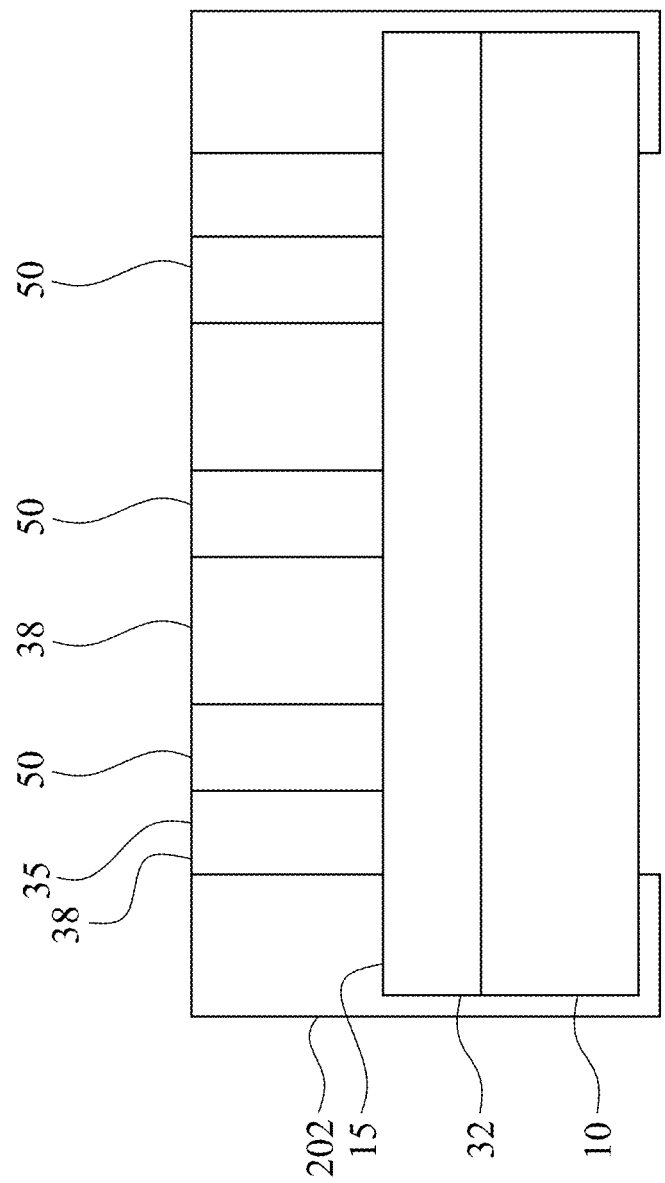
FIG. 10 shows a process stage of a sequential operation according to an embodiment of the disclosure.

After the exposing the photoresist layer to radiation, a second protective layer 202 is formed over the edge portion 15 of the substrate 10 in operation S130, as shown in FIG. 10, before the following operations, such as post-exposure baking and developing in some embodiments. Thus, the edge portion 15 of the substrate 10 is protected from any contamination during those operations by the second protective layer 202. The second protective layer 202 is substantially similar to the first protective layer 25 in terms of composition and formation. For example, the protective layer composition is first coated on the edge portion 15 of the substrate 10 by spin-coating and is then cured to form a polymer material as the second protective layer 202. Like the first protective layer 25, the protective layer composition includes a mixture of a polymer with ALGs and a TAG or TBG.

A third heating is performed in some embodiments in operation S135. The third heating is a combination of a post-exposure baking (PEB) operation and second protective layer curing operation. During the PEB operation, more acid is generated in the exposed portions 50 of the photoresist layer, and the exposed portions 50 of the photoresist layer are changed chemically (such as more hydrophilic or more hydrophobic). In some embodiments, PEB causes a TAG or TBG in the second protective layer to release an acid or a base, respectively. In some embodiments, the third heating temperature is in a range of about 100° C. to about 200° C. for about 10 seconds to about 10 minutes. In some embodiments, the second protective layer is heated for about 30 seconds to about 5 minutes. In some embodiments, the third heating is applied at a temperature in a range between about 130° C. and 170° C., and for a duration of about 60 seconds.

Figure 11:
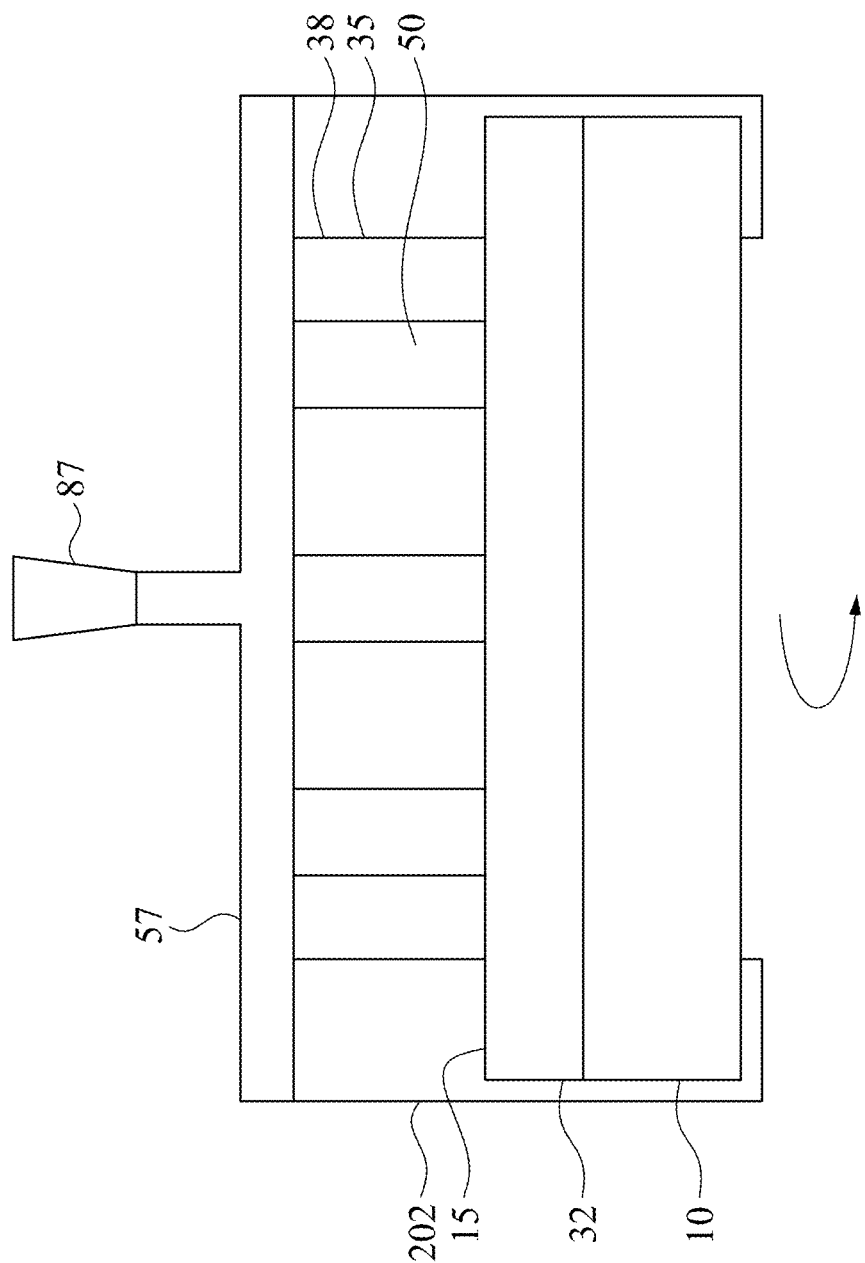
FIG. 11 shows a process stage of a sequential operation according to an embodiment of the disclosure.
Figure 12:
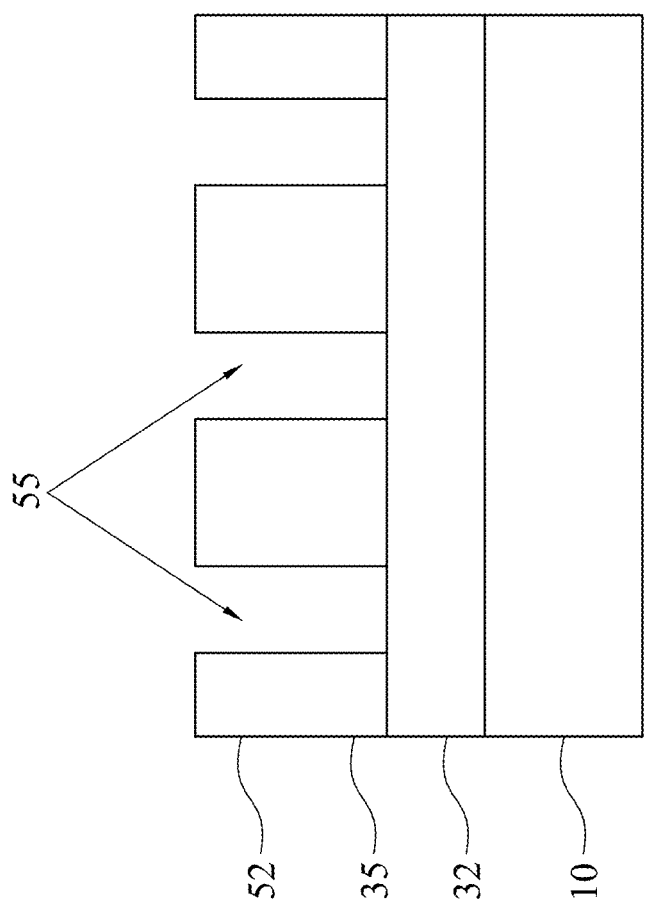
FIG. 12 shows a process stage of a sequential operation according to an embodiment of the disclosure.

Development is subsequently performed in operation S140 using a solvent, as shown in FIG. 11. In some embodiments where positive tone development is desired, a positive tone developer such as a basic aqueous solution is used to remove regions 50 of the photoresist exposed to radiation. In some embodiments, the positive tone developer 57 includes one or more selected from tetramethylammonium hydroxide (TMAH), tetrabutylammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide, combinations of these, or the like.

In some embodiments where negative tone development is desired, an organic solvent or critical fluid is used to remove the unexposed regions 38 of the photoresist. In some embodiments, the negative tone developer 57 includes one or more selected from hexane, heptane, octane, toluene, xylene, dichloromethane, chloroform, carbon tetrachloride, trichloroethylene, and like hydrocarbon solvents; critical carbon dioxide, methanol, ethanol, propanol, butanol, and like alcohol solvents; diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether and like ether solvents; acetone, methyl ethyl ketone, methyl isobutyl ketone, isophorone, cyclohexanone and like ketone solvents; methyl acetate, ethyl acetate, propyl acetate, butyl acetate and like ester solvents; pyridine, formamide, and N,N-dimethyl formamide or the like.

In some embodiments, the developer 57 is applied to the photoresist layer 35 using a spin-on process. In the spin-on process, the developer 57 is applied to the photoresist layer 35 by a dispenser 87 from above while the coated substrate is rotated, as shown in FIG. 11. The developer 57 is selected so that it removes the optional upper layer 42, the appropriate region of photoresist layer 35, and the second protective layer 202 in some embodiments. In some embodiments, the developer 57 is supplied at a rate of between about 5 ml/min and about 800 ml/min, while the coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 35 after exposure, it is intended to be illustrative and is not intended to limit the embodiment. Rather, any suitable development operations, including dip processes, puddle processes, and spray-on methods, may alternatively be used. All such development operations are included within the scope of the embodiments.

FIG. 6 illustrates another process flow according to embodiments of the disclosure. The method 145 includes an operation S150 of forming a first protective layer 25 over an edge portion 15 of the wafer 10. The operation S150 of forming the first protective layer 25 is the same as discussed with reference to operation S105 of FIG. 5. Likewise, the subsequent first heating operation S155 is the same as the operation S110 of FIG. 5. A photoresist layer 35 is subsequently formed over the substrate 10 in operation S160 in the same manner as discussed with reference to operation S115 of FIG. 5. In this embodiment, the photoresist layer 35 is heated in operation S165 before the first protective layer is removed in operation S170. The photoresist is heated under the same conditions disclosed in reference to operation S120 of FIG. 5, and the first protective layer 25 is removed in a similar manner as in operation S115 of FIG. 5, i.e. —using an OK73 solution. After removing the first protective layer, the photoresist layer 35 is selectively exposed to radiation in operation S175 in the same manner as discussed with reference to operation S125 of FIG. 5. A second protective layer 202 is subsequently formed over the edge portion 15 of the substrate in operation S180 in the same manner as discussed with reference to operation S130 of FIG. 5, and a post-exposure bake is performed in operation S185 in the same manner as in operation S135 of FIG. 5. Then the photoresist layer is developed in operation S190 in a similar manner as in operation S140 of FIG. 5, except the second protective layer 202 is not removed by the developer. Rather, the second protective layer 202 is removed using a different solvent, such as OK73, in operation S195 after the developing operation S190.

Figure 13:
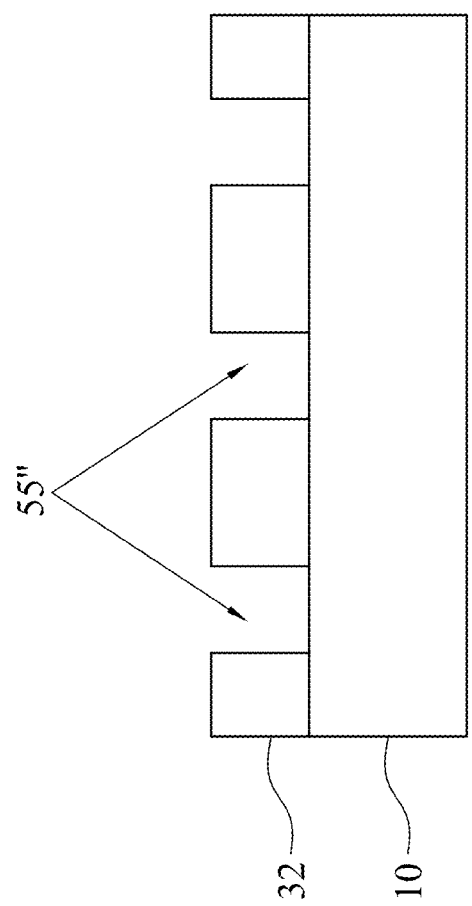
FIG. 13 shows a process stage of a sequential operation according to an embodiment of the disclosure.

After the developing operation S140 or second protective layer removal operation S195, remaining developer or protective layer removal solvent is removed from the patterned photoresist covered substrate. The remaining developer/protective layer removal solvent is removed using a spin-dry process in some embodiments, although any suitable removal technique may be used. Additional processing is the performed while the patterned photoresist layer is in place in some embodiments. For example, an etching operation, using dry or wet etching, is performed in some embodiments, to transfer the pattern 55 of the photoresist layer 35 to the layer to be patterned 32, forming recesses 55' as shown in FIG. 13. The layer to be patterned 32 has a different etch resistance than the photoresist layer 35. In some embodiments, the etchant is more selective to the layer to be patterned 32 than the photoresist layer 35.

In some embodiments, the layer to be patterned 32 and the photoresist layer 35 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

In some embodiments, etching operations include a dry (plasma) etching, a wet etching, and/or other etching methods. For example, a dry etching operation may implement an oxygen-containing gas, a fluorine-containing gas, a chlorine-containing gas, a bromine-containing gas, an iodine-containing gas, other suitable gases and/or plasmas, and/or combinations thereof. The patterned resist layer may be partially or completely consumed during the etching of the hard mask layer. In an embodiment, any remaining portion of the patterned resist layer may be stripped off, leaving a patterned hard mask layer over the wafer.

Protective layer compositions according to embodiments of the disclosure will be discussed in greater detail with reference to FIGS. 14-17.

Figure 14:
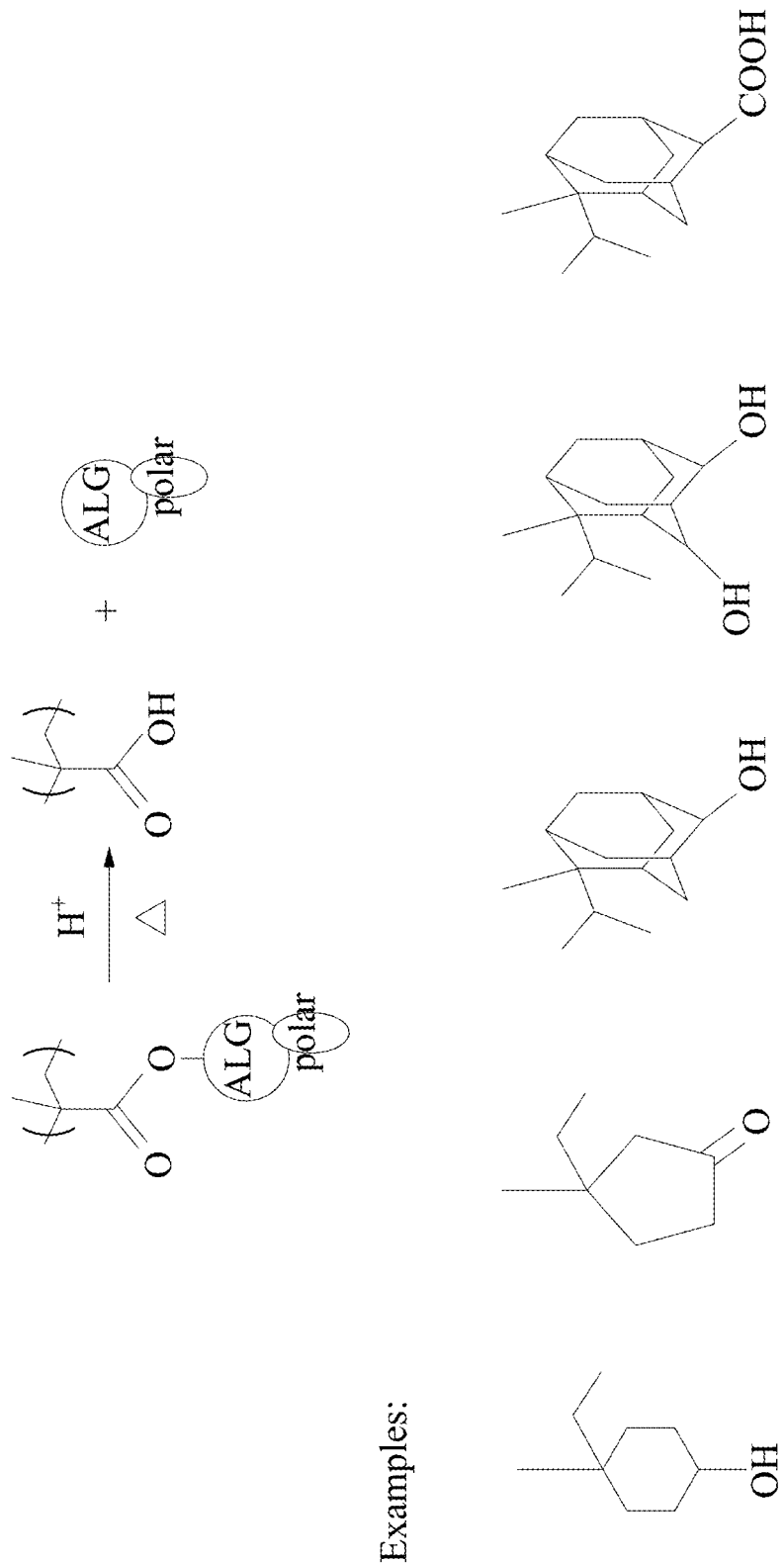
FIG. 14 shows polymer compositions according to embodiments of the disclosure.

FIG. 14 shows a first embodiment of the polymer according to the disclosure. Polar functional groups are connected to acid-labile groups (ALGs) pendant to the polymer main chain. The polar functional groups are one or more of —OH, =O, —S—, —P— —P(O$_2$)—, —C(=O) SH, —C(=O) OH, —C(=O)O—, —O—, —N—, —C(=O)NH, —SO$_2$OH, —SO$_2$SH, —SOH, and —SO$_2$—. As shown, heating the protective layer composition causes an acid generator, such as a thermal acid generator, to release an acid that cleaves the ALG and polar functional group from the polymer. In some embodiments, this embodiment includes a connecting group connecting the pendant acid-labile group to the polar functional group, wherein the connecting group is selected from branched and unbranched aliphatic groups, branched or unbranched aromatic groups, 1-9 carbon cyclic and non-cyclic groups, and each of the groups are optionally substituted with a halogen or oxygen. Examples of the acid-labile pendant groups with polar groups are shown in FIG. 14. Although the ALG undergoes a deprotection reaction, because the polar groups interact with the polymer they do not leave the composition.

Figure 15:
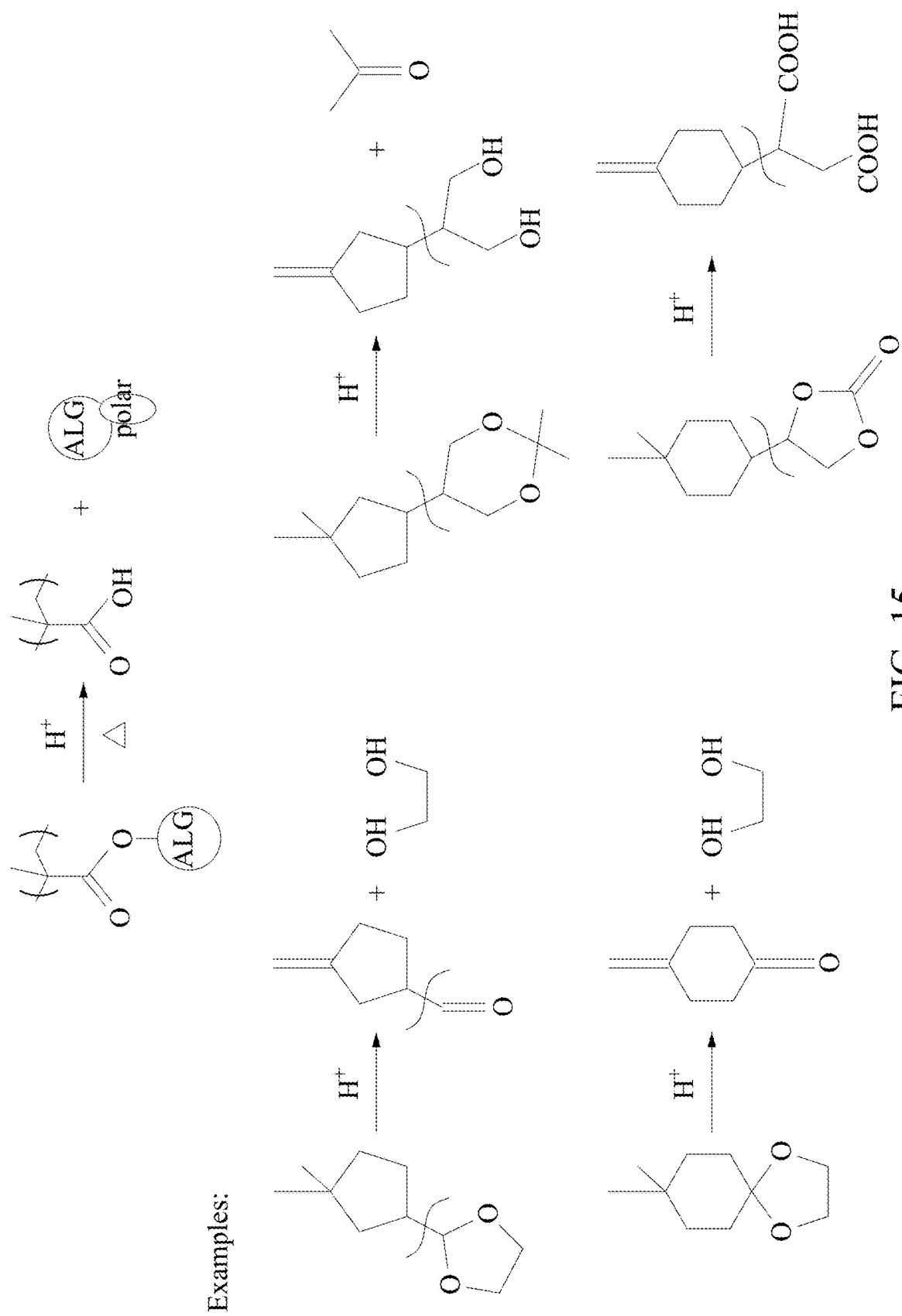
FIG. 15 shows polymer compositions according to embodiments of the disclosure.

FIG. 15 shows a second embodiment of the polymer according to the disclosure. In some embodiments, the polar switch functional groups are selected from one or more of acetal groups, acetonide groups, and anhydride groups. As shown, heating the protective layer composition causes an acid generator, such as a thermal acid generator, to release an acid that cleaves the ALG and polar switch functional groups from the polymer. The second embodiment of the polymer further includes a connecting group connecting the pendant acid-labile group to the polar switch group, wherein the connecting group is selected from branched and unbranched aliphatic groups, branched or unbranched aromatic groups, 1-9 carbon cyclic and non-cyclic groups, and each of the groups are optionally substituted with a halogen or oxygen. Examples of the acid-labile pendant groups with polar switch groups are shown in FIG. 15. As shown, the acid deprotection reaction creates a polar reaction product that interacts with the ALG and inhibits the ALG from departing from the composition.

FIG. 16 shows a third embodiment of polymer according to the disclosure. Bulky or rigid ALG groups are pendant to the polymer main chain. The bulky or rigid ALG groups have the structure

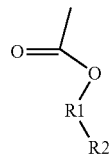

where R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alkyl carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alkyl carboxyl group, or C4-C9 cycloalkyl carboxyl group. Exemplary ALG structures are shown in FIG. 16. In some embodiments, more than 5% of the ALGs pendant to the polymer chain are the disclosed bulky or rigid groups. The bulky or rigid groups are less likely to depart from the polymer composition. Thus, the polymer becomes more rigid and less likely to form voids.

FIG. 17 shows the fourth embodiment of the polymer according to the disclosure. The polymer with includes pendant five and six-member pendant lactone rings. A base generator, such as a thermal base generator, is included in the polymer composition. The generated base opens the lactone ring, creating polar groups that become soluble in basic solutions, such as a tetramethyl ammonium hydroxide (TMAH) solution. In some embodiments, the polymer includes pendant ALGs and a thermal acid generator.

The fifth embodiment of the polymer according to the disclosure includes from 20 wt. % to 70 wt. % of the pendant acid-labile groups and carboxylic acid groups based on a total weight of the polymer, wherein the percent of the pendant acid-labile groups and carboxylic acid groups that are carboxylic acid groups ranges from 5% to 20% based on the total number of pendant acid-labile groups and carboxylic acid groups. At greater than 20% carboxylic acid groups, the polymer has poor solubility in the solvent and poor coating performance. At less then 5% carboxylic acid groups there is not a sufficient improvement in the protective layers shrinkage and void reduction.

Figure 18:
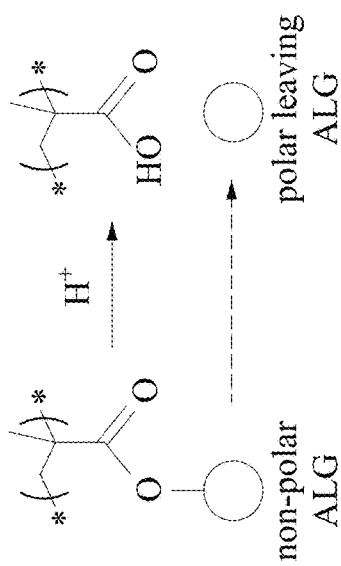
FIG. 18 illustrates the acid-labile group reaction according to embodiments of the disclosure.

FIG. 18 illustrates the acid deprotection reaction caused by the acid generated by the acid generator and the acid-labile group. The polar leaving group of embodiments of the present disclosure is more likely to remain associated with the polymer composition than non-polar ALG.

In some embodiments, the polymer main chain having the pendant ALG or lactone groups is a hydrocarbon chain. In some embodiments, the polymer is a polyhydroxystyrene, polyacrylate, or polymethylmethacrylate based polymer.

Wafer edge protective compositions according to embodiments of the present disclosure include an acid generator and a polymer having pendant acid-labile groups. The pendant acid-labile groups are one or more polar functional groups selected from the group consisting of

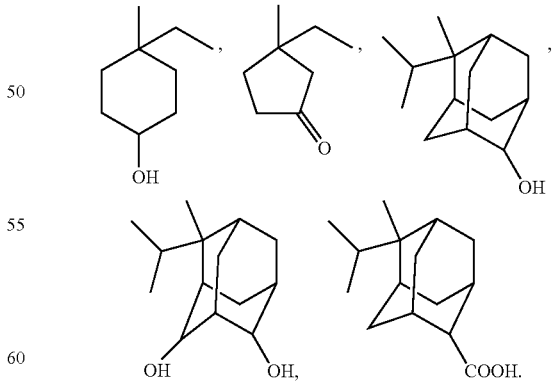

In some embodiments, the polymer includes from 20 wt. % to 70 wt. % of the pendant acid-labile groups based on a total weight of the polymer. In some embodiments, the composition includes a connecting group connecting the pendant acid-labile group to the polar functional groups, wherein the connecting group is selected from substituted and unsubstituted, branched and unbranched aliphatic groups, substituted and unsubstituted, branched and unbranched aromatic groups, and substituted and unsubstituted 1-9 carbon cyclic and non-cyclic groups.

Another embodiment of the disclosure is a composition including an acid generator; and a polymer having pendant acid-labile groups including one or more polar functional groups selected from —S—, —P—, —P(O₂)—, —C(=O) SH, —N—, —C(=O)NH, —SO₂OH, —SO₂SH, —SOH, and —SO₂—. In some embodiments, the polymer includes a connecting group connecting the pendant acid-labile group to the one or more polar functional groups, wherein the connecting group is selected from substituted and unsubstituted, branched and unbranched aliphatic groups, substituted and unsubstituted, branched and unbranched aromatic groups, and substituted and unsubstituted 1-9 carbon cyclic and non-cyclic groups.

Another embodiment of the disclosure is a composition, including: an acid generator; and a polymer having pendant acid-labile groups, wherein the acid-labile groups include one or more polar switch functional groups selected from one or more of acetal groups, acetonide groups, and anhydride groups. In some embodiments, the acid-labile groups include one or more selected from

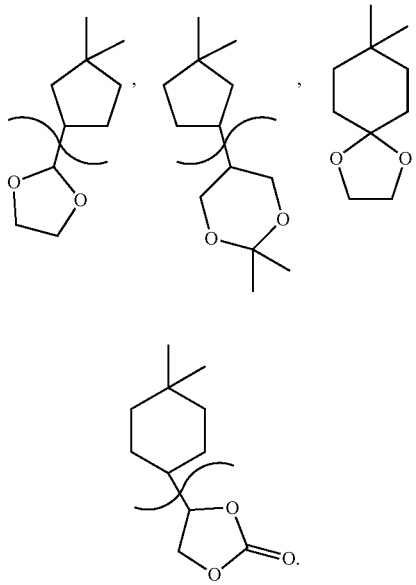

In an embodiment, the polymer comprises from 20 wt. % to 70 wt. % of the pendant acid-labile groups based on a total weight of the polymer. In some embodiments, the composition includes a connecting group connecting the pendant acid-labile groups to the polar switch functional groups, wherein the connecting group is selected from substituted and unsubstituted, branched and unbranched aliphatic groups, substituted and unsubstituted, branched and unbranched aromatic groups, and substituted and unsubstituted 1-9 carbon cyclic and non-cyclic groups.

Another embodiment of the disclosure is a composition, including: an acid generator; and a polymer having pendant acid-labile groups, wherein greater than 5% of the acid-labile groups include

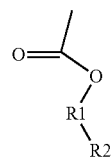

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alkyl carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alkyl carboxyl group, or C4-C9 cycloalkyl carboxyl group. In an embodiment, the polymer includes from 20 wt. % to 70 wt. % of the pendant acid-labile groups based on a total weight of the polymer. In some embodiments, the pendant acid-labile group is selected from the group consisting of

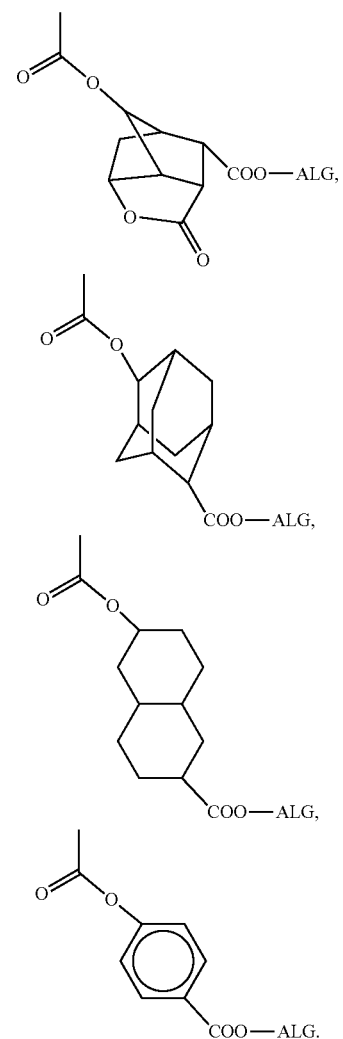

Another embodiment of the disclosure is a composition, a base generator and a polymer having lactone groups. In some embodiments, the polymer includes pendant acid-labile groups and the composition includes an acid generator. In some embodiments, the polymer includes from 20 wt. % to 70 wt. % of the pendant acid-labile groups and the pendant lactone groups based on a total weight of the polymer. In some embodiments, the base generator is a thermal base generator. In some embodiments, the pendant lactone groups are 5 or 6 member rings. In some embodiments, the pendant lactone groups are selected from

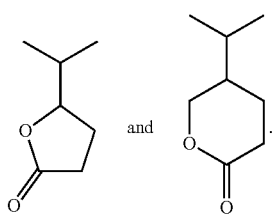

In some embodiments, the pendant lactone group is a γ-butyrolactone. In some embodiments, the thermal base generator (TBG) is one or more selected from the group consisting of:

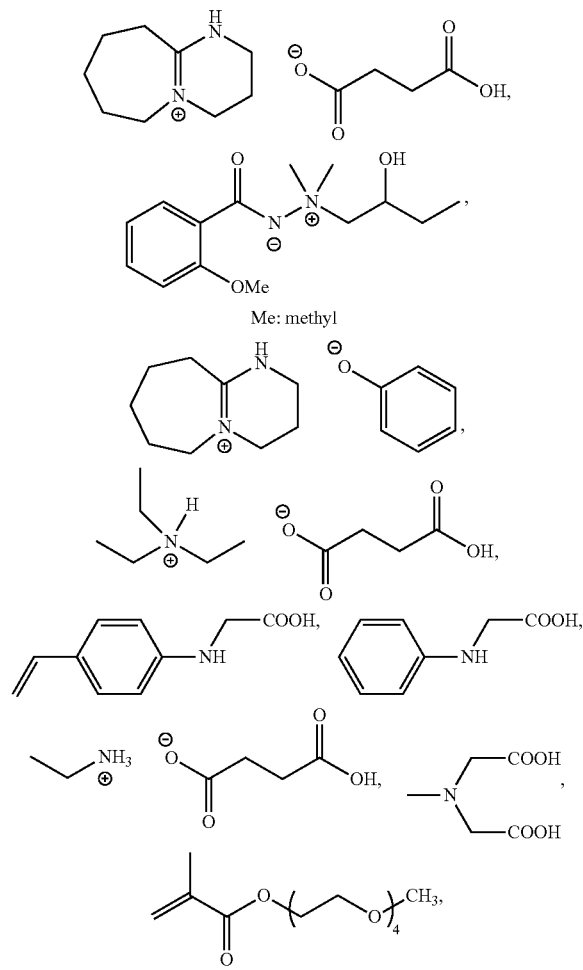

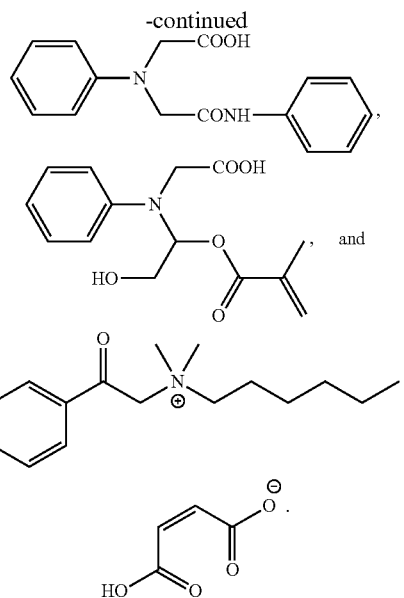

In some embodiments, the thermal base generator (TBG) is N-(p-nitrophenyl)-2,6-dimethylpiperidine (NDP).

Another embodiment of the disclosure is a composition, including: a thermal acid generator; and a polymer having pendant acid-labile groups and pendant carboxylic acid groups. 5% to 20% of the total number of pendant acid-labile groups and pendant carboxylic acid groups are carboxylic acid groups. In some embodiments, the polymer comprises from 20 wt. % to 70 wt. % of the pendant acid-labile groups and carboxylic acid groups based on a total weight of the polymer.

In some embodiments of the protective layer composition, the acid generator is a thermal acid generator (TAG). In some embodiments, the TAG is one or more selected from the group consisting of

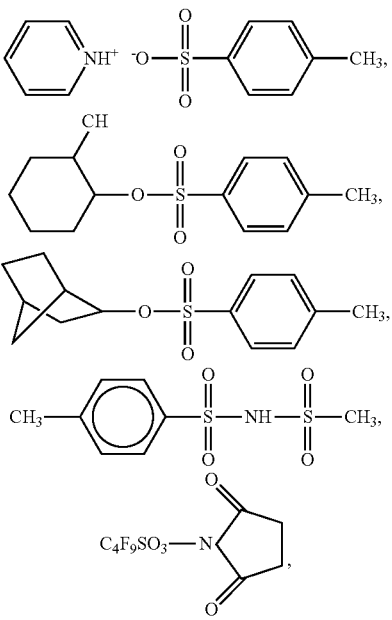

-continued

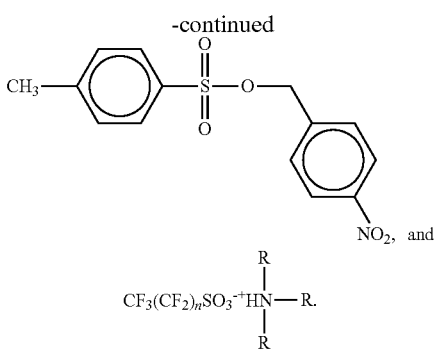

In some embodiments, the TAG is selected from $NH_4^+C_4F_9SO_3^-$ and $NH_4CF_3SO_3^-$.

In some embodiments, protective layer compositions include a solvent. In some embodiments, the solvent is a suitable aqueous or organic solvent. In some embodiments, the solvent is selected from ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Figure 19:
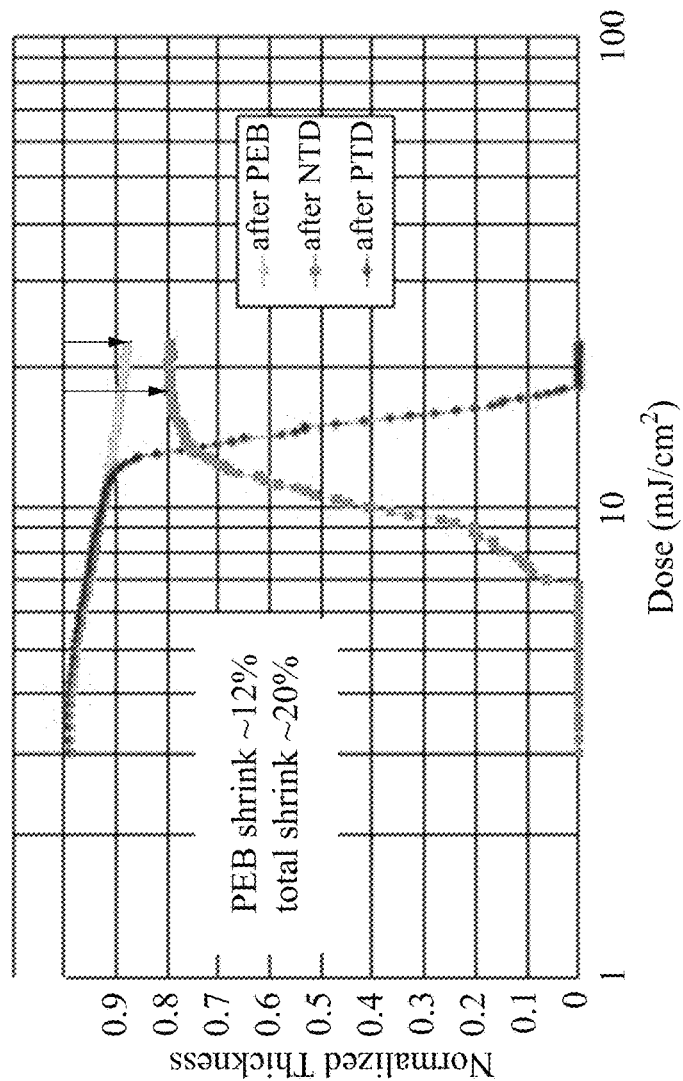
FIG. 19 shows layer shrinkage according to an embodiment of the disclosure.

Specific examples of the solvent for the protective layer composition include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, butyl acetate, methyl lactate, ethyl lactate, propyl lactate, butyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether, methyl propionate, ethyl propionate, ethyl ethoxy propionate, methylethyl ketone, cyclohexanone, 2-heptanone, cyclopentanone, cyclohexanone, ethyl 3-ethoxypropionate, propylene glycol methyl ether acetate (PGMEA), methylene cellosolve, 2-ethoxyethanol, N-methylformamide, N,N-dimethylformamide, N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like In some embodiments, a protective layer is present on the edge portion of the substrate during the development operation. As shown in FIG. 19, protective layers of the present disclosure have less shrinkage than conventional protective layers. As shown the total shrinkage in the exemplary embodiment is about 20%, while conventional protective layers exhibit about 30% shrinkage. As shown in FIG. 19, most of the shrinkage (12%) occurs during post exposure bake prior to development. FIG. 19 also illustrates the thickness of the layer after negative tone development (NTD) and positive tone development.

In some embodiments, the substrate includes a single crystalline semiconductor layer on at least it surface portion. The substrate may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate is a silicon layer of an SOI (silicon-on insulator) substrate. In certain embodiments, the substrate is made of crystalline Si. In certain embodiments, the substrate is a silicon wafer.

The substrate may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate. The germanium concentration of the SiGe buffer layers may increase from 30 atomic % for the bottom-most buffer layer to 70 atomic % for the top-most buffer layer.

In some embodiments, the substrate includes at least one metal, metal alloy, and metal/nitride/sulfide/oxide/silicide having the formula $MX_a$, where M is a metal and X is N, S, Se, O, Si, and a is from about 0.4 to about 2.5. In some embodiments, the substrate includes titanium, aluminum, cobalt, ruthenium, titanium nitride, tungsten nitride, tantalum nitride, and combinations thereof.

In some embodiments, the substrate includes a dielectric layer having at least silicon, metal oxide, and metal nitride of the formula $MX_b$, where M is a metal or Si, X is N or O, and b ranges from about 0.4 to about 2.5. Ti, Al, Hf, Zr, and La are suitable metals, M, in some embodiments. In some embodiments, the substrate includes silicon dioxide, silicon nitride, aluminum oxide, hafnium oxide, lanthanum oxide, and combinations thereof.

The photoresist layer is a photosensitive layer that is patterned by exposure to actinic radiation. Typically, the chemical properties of the photoresist regions struck by incident radiation change in a manner that depends on the type of photoresist used. Whether a resist is a positive tone or negative tone may depend on the type of developer used to develop the resist. For example, some positive tone photoresists provide a positive pattern, (i.e. —the exposed regions are removed by the developer), when the developer is an aqueous-based developer, such as a tetramethylammonium hydroxide (TMAH) solution. On the other hand, the same photoresist provides a negative pattern (i.e. —the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

Photoresists according to the present disclosure include a polymer resin along with one or more photoactive compounds (PACs) in a solvent, in some embodiments. In some embodiments, the polymer resin includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as a leaving group or, in some embodiments in which the PAC is a photoacid generator, an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl)(alkylcarbonyl) methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer resin also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer resin includes groups that can assist in increasing the adhesiveness of the photoresist layer to underlying structures (e.g., substrate). Polar groups may be used to help increase the adhesiveness. Suitable polar groups include hydroxyl groups, cyano groups, or the like, although any suitable polar group may, alternatively, be used.

Optionally, the polymer resin includes one or more alicyclic hydrocarbon structures that do not also contain a group, which will decompose in some embodiments. In some embodiments, the hydrocarbon structure that does not contain a group which will decompose includes structures such as 1-adamantyl (meth)acrylate, tricyclodecanyl (meth) acrylate, cyclohexyl (methacrylate), combinations of these, or the like.

Additionally, some embodiments of the photoresist include one or more photoactive compounds (PACs). The PACs are photoactive components, such as photoacid generators, photobase generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl) hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl) iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl) iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

Structures of photoacid generators according to the embodiments of the disclosure include:

cations

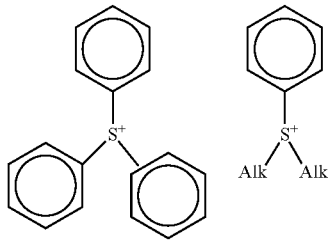

anions

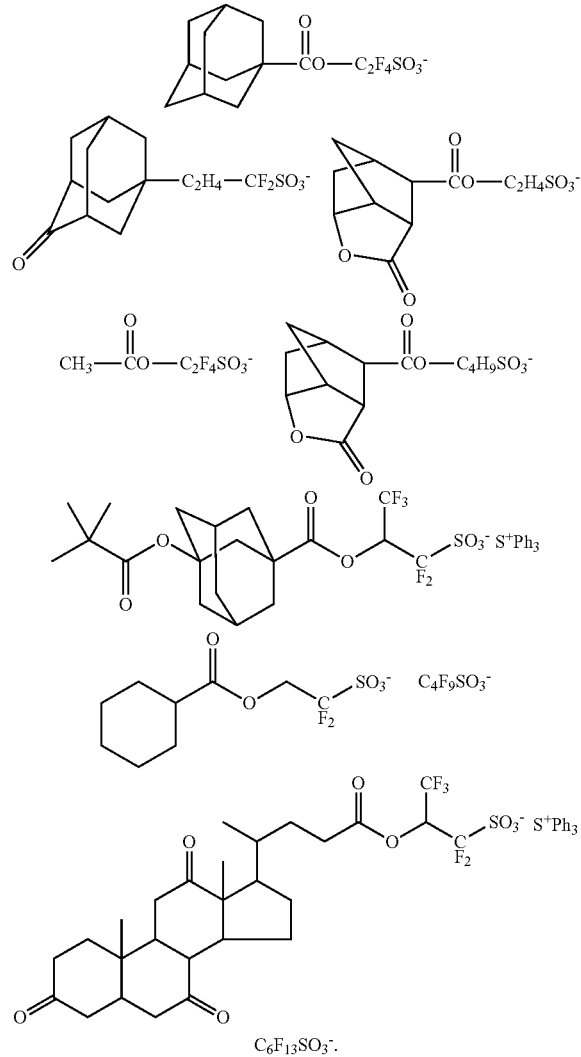

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl) heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments in which the PACs are photobase generators, the PACs includes quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross-linking agent is added to the photoresist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

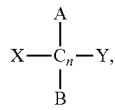

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

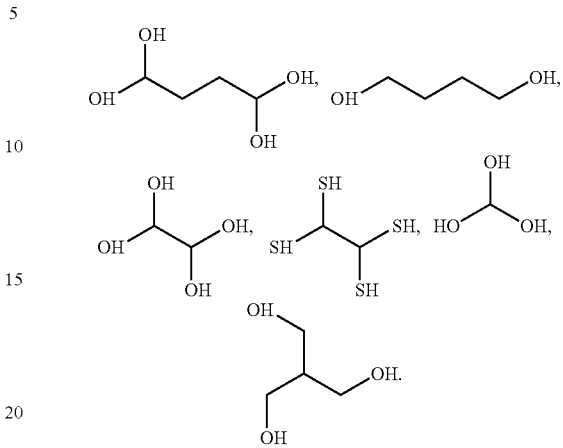

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist without the cross-linking agent, the coupling reagent is used to couple one group from one of the hydrocarbon structures in the polymer resin to a second group from a separate one of the hydrocarbon structures in order to cross-link and bond the two polymers together.

However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

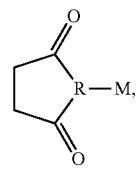

where R is a carbon atom, a nitrogen atom, a sulfur atom, or an oxygen atom; M includes a chlorine atom, a bromine atom, an iodine atom, $-NO_2$; $-SO_3-$; $-H-$; $-CN$; $-NCO$, $-OCN$; $-CO_2-$; $-OH$; $-OR^*$, $-OC(O)CR^*$; $-SR$, $-SO_2N(R^*)_2$; $-SO_2R^*$; $SOR$; $-OC(O)R^*$; $-C(O)OR^*$; $-C(O)R^*$; $-Si(OR^*)_3$; $-Si(R^*)_3$; epoxy groups, or the like; and $R^*$ is a substituted or unsubstituted C1-C12 alkyl, C1-C12 aryl, C1-C12 aralkyl, or the like. Specific examples of materials used as the coupling reagent in some embodiments include the following:

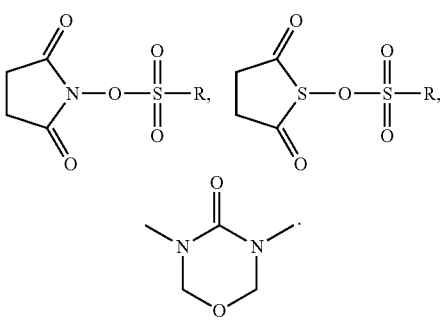

Some embodiments of the photoresist are metal-containing photoresists. In some embodiments, the metal-containing photoresist forms a metal-containing photoresist layer. The metals in the metal-containing photoresist includes one or more of Cs, Ba, La, Ce, In, Sn, or Ag in some embodiments.

In some embodiments, the metal-containing photoresist includes metal oxide nanoparticles. The metal oxides nanoparticles are selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof in some embodiments. As used herein, nanoparticles are particles having an average particle size between 1 and 10 nm. In some embodiments, the metal oxide nanoparticles have an average particle size between 2 and 5 nm. In some embodiments, the amount of metal oxide nanoparticles in the photoresist composition ranges from about 1 wt. % to about 10 wt. % based on the total weight of the photoresist composition. In some embodiments, metal oxide nanoparticle concentrations below 1 wt. % provide photoresist layers that are too thin, and metal oxide nanoparticle concentrations greater than about 10 wt. % provide a photoresist composition that is too viscous and that will be difficult to provide a photoresist coating of uniform thickness on the substrate.

In some embodiments, the metal oxide nanoparticles are complexed with carboxylic acid or sulfonic acid ligands. For example, in some embodiments, zirconium oxide or hafnium oxide nanoparticles are complexed with methacrylic acid forming hafnium methacrylic acid (HfMAA) or zirconium methacrylic acid (ZrMAA). In some embodiments, the HfMAA or ZrMAA are dissolved at about a 5 wt. % to about 10 wt. % weight range in a coating solvent, such as propylene glycol methyl ether acetate (PGMEA). In some embodiments, about 1 wt. % to about 10 wt. % of a photoactive compound (PAC) based on the total weight of the photoresist composition to form a metal oxide resist.

In some embodiments, the photoresist layer is a tri-layer photoresist. A tri-layer photoresist includes a bottom layer (also referred to as an under layer), a middle layer, and a top layer (the top layer may also be referred to as a photosensitive layer). In some embodiments, the bottom layer includes a CxHyOz material, the middle layer includes a SiCxHyOz material, and the top layer includes a CxHyOz material. The CxHyOz material of the bottom layer is the same material as the CxHyOz material of the top layer in some embodiments, and are different materials in other embodiments. The top layer also includes a photoactive compound, such as a photoacid generator (PAG). This allows a photolithography process to be performed to pattern the top layer. In some embodiments, the top layer is patterned by a photolithography process, which may include one or more exposure, baking, developing, and rinsing processes (not necessarily performed in this order). The photolithography process patterns the top layer into a photoresist mask, which may have one or more trenches or openings that expose the middle layer therebelow. The middle layer is then etched using the photoresist mask to form a patterned middle layer, and the bottom layer is then etched using the patterned middle layer to form a patterned bottom layer in some embodiments. The patterned bottom layer is then used to pattern the various layers below. In embodiments where the photoresist layer is a tri-layer photoresist, the metal-containing material is located in any one of the bottom layer, the middle layer, the top layer, or in all of these layers.

In some embodiments, a concentration of metal in the metal-containing photoresist layer ranges from 10 wt. % to 50 wt. % based on the total weight of the metal-containing photoresist layer after drying off the solvent.

In some embodiments, the acid-labile group (ALG) decomposes by the action of the acid generated by the photoacid generator leaving a carboxylic acid group pendant to the polymer resin chain, as shown in the ALG de-protect reaction:

ALG de-protect reaction

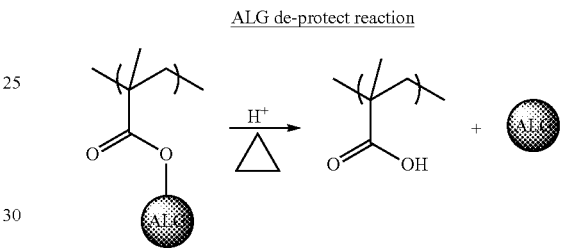

In some embodiments, the photoresist includes a protective polymer that forms a protective layer when applied to a layer to be patterned or substrate. In some embodiments, the protective polymer has pendant fluorocarbon groups and pendant acid-labile groups. In an embodiment, a main chain of the polymer having pendant fluorocarbon groups and pendant acid-labile groups is a polyhydroxystyrene, a polyacrylate, or a polymer formed from a 1 to 10 carbon monomer. In an embodiment, the polymer having pendant fluorocarbon groups and pendant acid-labile groups includes from about 0.1 wt. % to about 10 wt. % of one or more polar functional groups selected from the group consisting—OH, —$NH_3$, —$NH_2$, and —$SO_3$ based on the total weight of the polymer having fluorocarbon groups.

The individual components of the photoresist are placed into a solvent in order to aid in the mixing and dispensing of the photoresist. To aid in the mixing and dispensing of the photoresist, the solvent is chosen at least in part based upon the materials chosen for the polymer resins as well as the PACs. In some embodiments, the solvent is chosen such that the polymer resins and the PACs can be evenly dissolved into the solvent and dispensed upon the layer to be patterned.

In some embodiments, the solvent is an organic solvent, and includes one or more of any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the photoresist include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, butyl acetate, methyl lactate, ethyl lactate, propyl lactate, butyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether, methyl propionate, ethyl propionate, ethyl ethoxy propionate, methylethyl ketone, cyclohexanone, 2-heptanone, cyclopentanone, cyclohexanone, ethyl 3-ethoxypropionate, propylene glycol methyl ether acetate (PGMEA), methylene cellosolve, 2-ethoxyethanol, N-methylformamide, N,N-dimethylformamide, N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like.

As one of ordinary skill in the art will recognize, the materials listed and described above as examples of materials that may be used for the solvent component of the photoresist are merely illustrative and are not intended to limit the embodiments. Rather, any suitable materials that dissolve the polymer resin and the PACs may be used to help mix and apply the photoresist. All such materials are fully intended to be included within the scope of the embodiments.

Additionally, while individual ones of the above described materials may be used as the solvent for the photoresist and protective polymer, in other embodiments more than one of the above described materials are used. For example, in some embodiments, the solvent includes a combination mixture of two or more of the materials described. All such combinations are fully intended to be included within the scope of the embodiments.

In addition to the polymer resins, the PACs, the solvents, the cross-linking agent, and the coupling reagent, some embodiments of the photoresist also includes a number of other additives that assist the photoresist to obtain high resolution. For example, some embodiments of the photoresist also includes surfactants in order to help improve the ability of the photoresist to coat the surface on which it is applied. In some embodiments, the surfactants include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, and polyoxyethylene sorbitan fatty acid esters.

Specific examples of materials used as surfactants in some embodiments include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether, polyoxyethylene cetyl ether, fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations thereof, or the like.

Another additive added to some embodiments of the photoresist composition and protective layer composition is a quencher, which inhibits diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

Some embodiments of quenchers include:

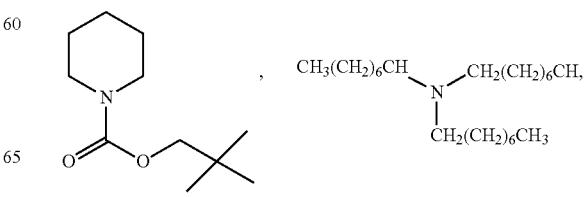

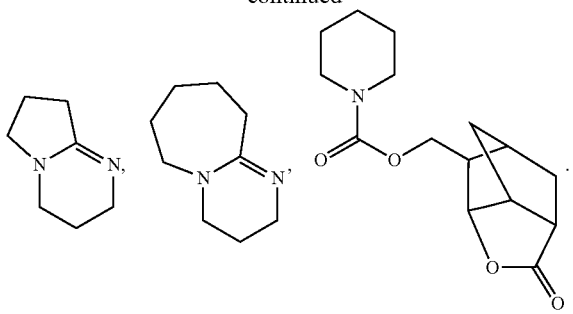

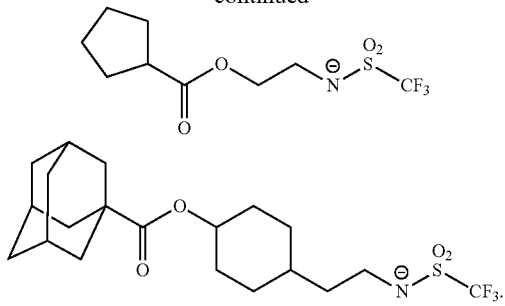

In some embodiments, the quencher is a photo decomposed base. Examples of photo decomposed bases are shown below, where R1 is an alicyclic group of 5 or more carbon atoms which may have a substituent, X is a divalent linking group, Y is a linear, branched or cyclic alkylene group or an arylene group; Rf is a hydrocarbon group containing a fluorine atom, and M is an organic cation or a metal cation:

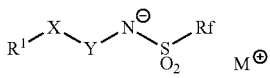

Example anion

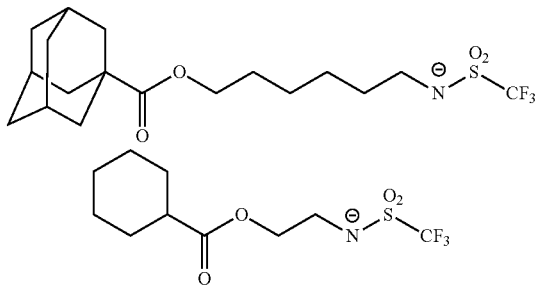

cation

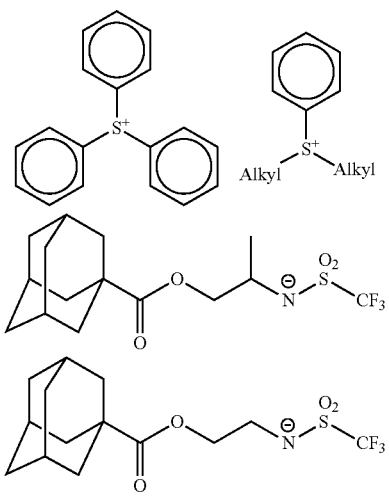

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof such as its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phenylphosphinic acid.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and aryl-ammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment bile-salt esters may be utilized as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent observers examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2', 4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, crystal violet, titanium oxide, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxpteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations thereof, or the like.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

Additional processing operations are performed in some embodiments to manufacture semiconductor devices. In some embodiments, the fabrication process includes an ion implantation process applied to the wafer using the patterned resist layer as an implantation mask, thereby forming various doped features in the wafer.

Other embodiments include other operations before, during, or after the operations described above. In an embodiment, the method includes forming fin field effect transistor (FinFET) structures. In some embodiments, a plurality of active fins are formed on the semiconductor substrate. Such embodiments, further include etching the substrate through the openings of the patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In another embodiment, the method includes other operations to form a plurality of gate electrodes on the semiconductor substrate. The method may further include forming gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, the semiconductor substrate 10 is an intermediate structure fabricated during processing of an IC, or a portion thereof, that may include logic circuits, memory structures, passive components (such as resistors, capacitors, and inductors), and active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Embodiments of the disclosure reduce contamination of the semiconductor substrate. In some embodiments, metal contamination from metal-containing photoresists is reduced according to embodiments of the disclosure. In addition, to reduced contamination of the semiconductor substrate, contamination of semiconductor device processing tools is reduced. Reduced contamination on the substrates, also results in reduced contamination of the processing tools that handle and come into contact with the substrates during processing. Because the ALG groups of the protective compositions remain in the protective layer composition, protective layer shrinkage and void formation is reduced compared to conventional protective layer compositions. The reduced shrinkage and void formation prevents contaminants from breaching the protective layer and contaminating the underlying substrate. Thus, the substrate edges are better protected from contamination from the metals in metal-containing photoresists by embodiments of the present disclosure. In embodiments of the disclosure, the wafer edge contamination after photolithographic processing is less than $1\times10^{11}$ atom/cm$^2$ in contrast to $1\times10^{12}$ to $1\times10^{14}$ atom/cm$^2$ in wafers not using the composition and methods of the present disclosure.

An embodiment of the disclosure is a method of manufacturing a semiconductor device, including forming a first protective layer over an edge portion of a first main surface of a semiconductor substrate. A photoresist layer is formed over the first main surface of the semiconductor substrate. The first protective layer is removed, and the photoresist layer is selectively exposed to actinic radiation. The first protective layer is made of a composition including: an acid generator; and a polymer having pendant acid-labile groups, wherein the pendant acid-labile groups include one or more polar functional groups; a polymer having pendant acid-labile groups, wherein the pendant acid-labile groups include one or more polar switch functional groups; a polymer having pendant acid-labile groups, wherein greater than 5% of the pendant acid-labile groups have a structure

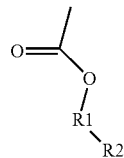

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alkyl carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alkyl carboxyl group, or C4-C9 cycloalkyl carboxyl group; a polymer having pendant acid-labile groups and lactone pendant groups; or a polymer having pendant acid-labile groups and pendant carboxylic acid groups. In an embodiment, the acid generator is a thermal acid generator. In an embodiment, the method includes a first heating of the first protective layer at a temperature of 100° C. to 200° C. for 10 seconds to 5 minutes before forming the photoresist layer. In an embodiment, the photoresist is a metal-containing photoresist. In an embodiment, the method includes forming a second protective layer over the edge portion of the first main surface of the semiconductor substrate after selectively exposing the photoresist layer to actinic radiation. In an embodiment, the second protective layer is made of a composition including: a thermal acid generator; and a polymer having pendant acid-labile groups, wherein the pendant acid-labile groups include one or more polar functional groups; a polymer having pendant acid-labile groups, wherein the acid-labile groups include one or more polar switch functional groups; a polymer having pendant acid-labile groups, wherein greater than 5% of the pendant acid-labile groups have a structure

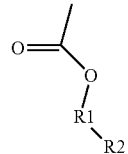

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alkyl carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alkyl carboxyl group, or C4-C9 cycloalkyl carboxyl group; a polymer having pendant acid-labile groups and lactone pendant groups; or a polymer having pendant acid-labile groups and pendant carboxylic acid groups. In an embodiment, the method includes a second heating of the selectively exposed photoresist layer and the second protective layer at a temperature of 100° C. to 200° C. for 10 seconds to 5 minutes. In an embodiment, the method includes developing the selectively exposed photoresist layer to form a patterned photoresist layer. In an embodiment, the method includes removing the second protecting layer after the developing the selectively exposed photoresist layer. In an embodiment, the method includes a third heating of the first protective layer and the photoresist layer at a temperature between about 40° C. and 120° C. for about 10 seconds to about 10 minutes before removing the first protective layer. In an embodiment, the polymer includes a connecting group connecting the pendant acid-labile group to the polar functional group or the polar switch functional groups, wherein the connecting group is selected from substituted and unsubstituted, branched and unbranched aliphatic groups, substituted and unsubstituted, branched and unbranched aromatic groups, and substituted and unsubstituted 1-9 carbon cyclic and non-cyclic groups. In an embodiment, the one or more polar functional groups are selected from one or more of —OH, —O, —S—, —P— —P(O$_2$)—, —C(=O) SH, —C(=O) OH, —C(=O)O—, —O—, —N—, —C(=O)NH, —SO$_2$OH, —SO$_2$SH, —SOH, and —SO$_2$—. In an embodiment, the acid-labile group is selected from the group consisting of

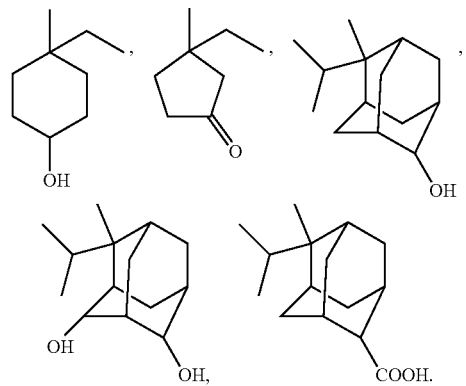

In an embodiment, the polar switch functional groups are selected from one or more of acetal groups, acetonide groups, and anhydride groups. In an embodiment, the pendant acid-labile group is selected from the group consisting of

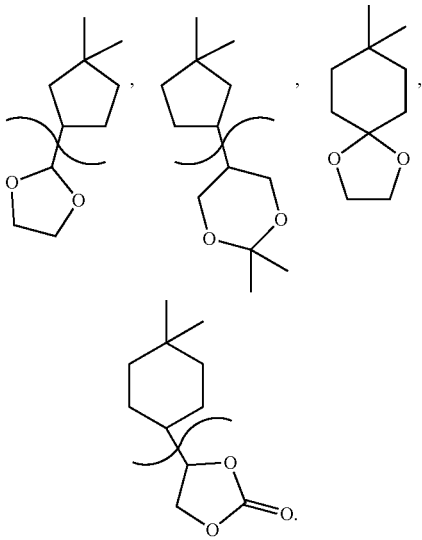

In an embodiment, the pendant acid-labile group is selected from the group consisting of

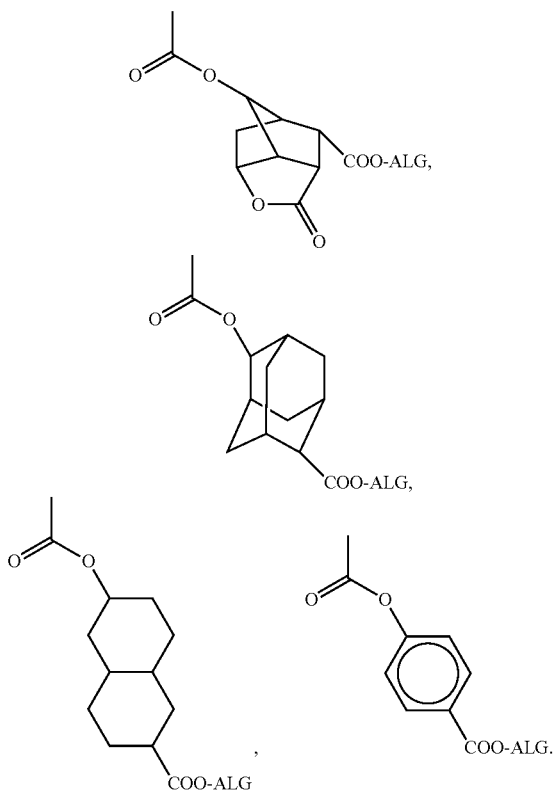

In an embodiment, the composition further includes a base generator. In an embodiment, the pendant lactone groups are selected from

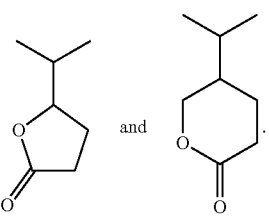

Another embodiment of the disclosure is a method of forming a photoresist pattern, including forming a first protective layer over a substrate and heating the first protective layer. A photoresist layer is formed over the first protective layer, and the first protective layer is removed. The photoresist layer is selectively exposed to actinic radiation and a second protective layer is formed over the substrate. The photoresist layer is developed to form a pattern in the photoresist layer, and the second protective layer is removed. The first the and second protective layers are made of a composition including: an acid generator; and a polymer having pendant acid-labile groups, wherein the pendant acid-labile groups include one or more polar functional groups; a polymer having pendant acid-labile groups, wherein the acid-labile groups include one or more polar switch functional groups; a polymer having pendant acid-labile groups, wherein greater than 5% of the pendant acid-labile groups have a structure

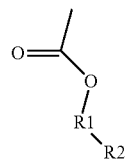

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alkyl carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alkyl carboxyl group, or C4-C9 cycloalkyl carboxyl group; a polymer having pendant acid-labile groups and lactone pendant groups; or a polymer having pendant acid-labile groups and pendant carboxylic acid groups. In an embodiment, the first protective layer is formed around a periphery of the substrate. In an embodiment, the forming the first protective layer includes forming the first protective layer over an upper surface and side surfaces of the substrate, and removing the first protective layer from the upper surface except for the periphery of the substrate before forming the photoresist layer. In an embodiment, the first protective layer composition is applied to a periphery of the substrate, and the substrate is rotated after the first protective layer composition is applied or while the first protective layer composition is being applied. In an embodiment, the photoresist composition is applied to a central portion of the substrate, and the substrate is rotated after the photoresist layer composition is applied or while the photoresist composition is being applied. In an embodiment, the method includes heating the photoresist layer before selectively exposing the photoresist layer to actinic radiation. In an embodiment, the method includes heating the selectively exposed photoresist layer before developing the photoresist layer. In an embodiment, the first protective layer and the second protective layer are removed using a mixture of propylene glycol methyl ether acetate and propylene glycol methyl ether. In an embodiment, the first protective layer is removed using a mixture of propylene glycol methyl ether acetate and propylene glycol methyl ether, and the second protective layer is removed using a different solvent. In an embodiment, the photoresist layer includes a metal oxide. In an embodiment, the actinic radiation is extreme ultraviolet radiation.

Another embodiment of the disclosure includes a wafer protective composition, including: an acid generator; and a polymer having pendant acid-labile groups. The pendant acid-labile groups are selected from the group consisting of

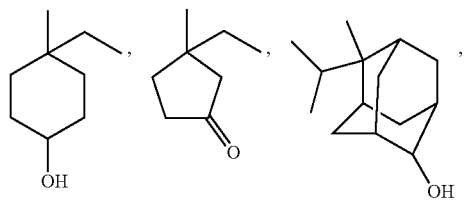

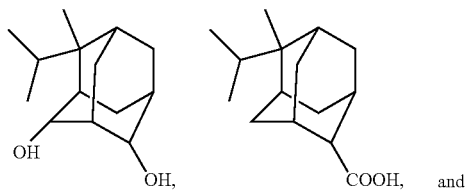

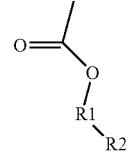

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alkyl carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alkyl carboxyl group, or C4-C9 cycloalkyl carboxyl group; or the polymer having pendant acid-labile groups includes polar switch functional groups selected from one or more of acetal groups, acetonide groups, and anhydride groups; or the polymer having pendant acid-labile groups includes pendant lactone groups, and the composition includes a thermal base generator. In an embodiment, the polymer comprises from 20 wt. % to 70 wt. % of the pendant acid-labile groups based on a total weight of the polymer. In an embodiment, the composition further includes a solvent. In an embodiment, the acid generator is a thermal acid generator. In an embodiment, the polar switch functional groups are selected from

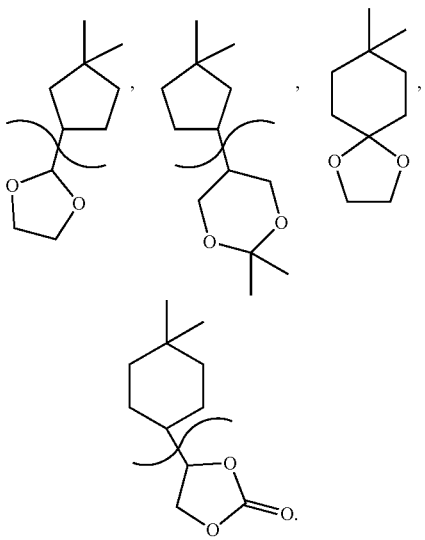

In an embodiment, the pendant acid-labile group is selected from the group consisting of

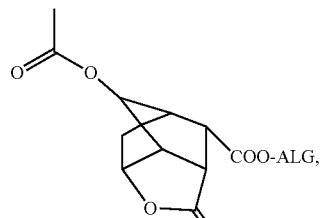

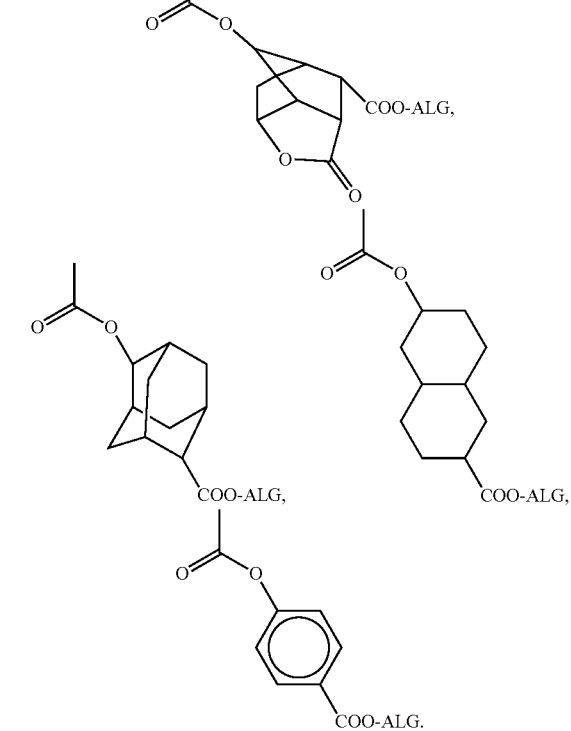

In an embodiment, the composition further includes a base generator.

Another embodiment of the disclosure is a method, including forming a first protective layer over an upper surface and side surfaces of substrate. The first protective layer is removed from the upper surface of the substrate except for the periphery of the substrate. The first protective layer is cured and a metal-containing photoresist layer is formed over the first protective layer. The first protective layer is removed, and the photoresist layer is selectively exposed to radiation. The photoresist layer is developed to form a pattern in the photoresist layer. The first protective layer is made of a composition including: an acid generator; and a polymer having pendant acid-labile groups, wherein the pendant acid-labile groups include one or more polar functional groups; a polymer having pendant acid-labile groups, wherein the acid-labile groups include one or more polar switch functional groups; a polymer having pendant acid-labile groups, wherein greater than 5% of the pendant acid-labile groups have a structure

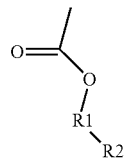

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alkyl carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alkyl carboxyl group, or C4-C9 cycloalkyl carboxyl group; a polymer having pendant acid-labile groups and lactone pendant groups; or a polymer having pendant acid-labile groups and pendant carboxylic acid groups. In an embodiment, the method includes forming a second protective layer over the upper surface of the substrate after the selectively exposing the photoresist layer to radiation. In an embodiment, the method includes heating the photoresist layer and second protective layer before the developing the photoresist layer. In an embodiment, the method includes removing the second protective layer after the developing the photoresist layer. In an embodiment, the method includes removing the first protective layer and the second protective layer using a mixture of propylene glycol methyl ether acetate and propylene glycol methyl ether. In an embodiment, the first protective layer is removed using a mixture of propylene glycol methyl ether acetate and propylene glycol methyl ether, and the second protective layer is removed using a different solvent. In an embodiment, the method includes heating the photoresist layer before selectively exposing the photoresist layer to actinic radiation. In an embodiment, the photoresist layer comprises a metal oxide. In an embodiment, the radiation is extreme ultraviolet radiation. In an embodiment, the composition includes a thermal base generator.

Another embodiment of the disclosure is a composition, including: an acid generator; and a polymer having pendant acid-labile groups. The pendant acid-labile groups are one or more polar functional groups selected from the group consisting of

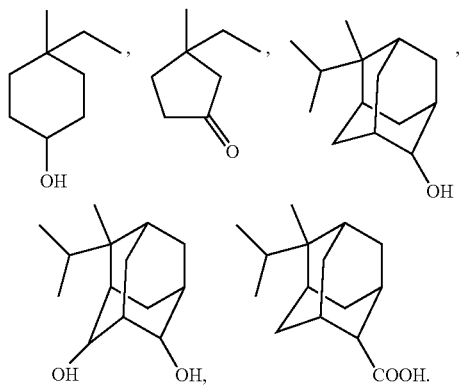

In an embodiment, the polymer includes from 20 wt. % to 70 wt. % of the pendant acid-labile groups based on a total weight of the polymer. In an embodiment, the composition includes a solvent. In an embodiment, the acid generator is thermal acid generator. In an embodiment, the composition includes a connecting group connecting the pendant acid-labile group to the polar functional groups, wherein the connecting group is selected from substituted and unsubstituted, branched and unbranched aliphatic groups, substituted and unsubstituted, branched and unbranched aromatic groups, and substituted and unsubstituted 1-9 carbon cyclic and non-cyclic groups.

Another embodiment of the disclosure is a composition including an acid generator;

and a polymer having pendant acid-labile groups including one or more polar functional groups selected from —S—, —P— —P(O₂)—, —C(=O) SH, —N—, —C(=O) NH, —SO₂OH, —SO₂SH, —SOH, and —SO₂—. In an embodiment, the polymer comprises from 20 wt. % to 70 wt. % of the pendant acid-labile groups based on a total weight of the polymer. In an embodiment, the composition includes a solvent. In an embodiment, the acid generator is thermal acid generator. In an embodiment, the polymer includes a connecting group connecting the pendant acid-labile group to the one or more polar functional groups, wherein the connecting group is selected from substituted and unsubstituted, branched and unbranched aliphatic groups, substituted and unsubstituted, branched and unbranched aromatic groups, and substituted and unsubstituted 1-9 carbon cyclic and non-cyclic groups.

Another embodiment of the disclosure is a composition, including: an acid generator; and a polymer having pendant acid-labile groups, wherein the acid-labile groups include one or more polar switch functional groups selected from one or more of acetal groups, acetonide groups, and anhydride groups. In an embodiment, the acid-labile groups include one or more selected from

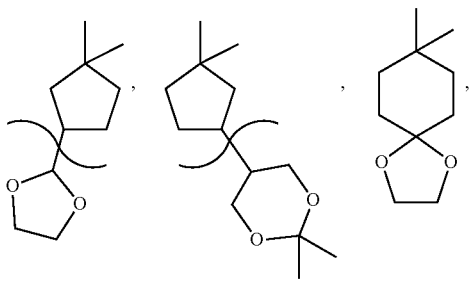

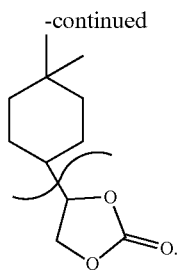

In an embodiment, the polymer comprises from 20 wt. % to 70 wt. % of the pendant acid-labile groups based on a total weight of the polymer. In an embodiment, the composition includes a solvent. In an embodiment, the acid generator is thermal acid generator. In an embodiment, the composition includes a connecting group connecting the pendant acid-labile groups to the polar switch functional groups, wherein the connecting group is selected from substituted and unsubstituted, branched and unbranched aliphatic groups, substituted and unsubstituted, branched and unbranched aromatic groups, and substituted and unsubstituted 1-9 carbon cyclic and non-cyclic groups.

Another embodiment of the disclosure is a composition, including: an acid generator; and a polymer having pendant acid-labile groups, wherein greater than 5% of the acid-labile groups include

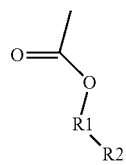

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alkyl carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alkyl carboxyl group, or C4-C9 cycloalkyl carboxyl group. In an embodiment, the polymer includes from 20 wt. % to 70 wt. % of the pendant acid-labile groups based on a total weight of the polymer. In an embodiment, the composition includes a solvent.

In an embodiment, the acid generator is a thermal acid generator. In an embodiment, the pendant acid-labile group is selected from the group consisting of

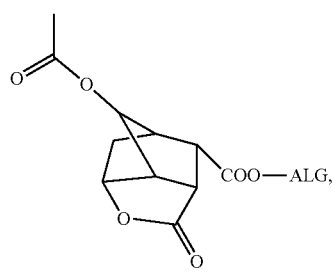

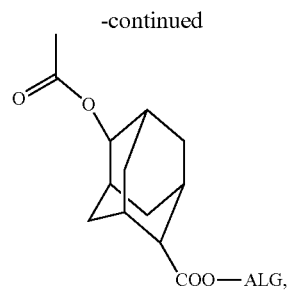

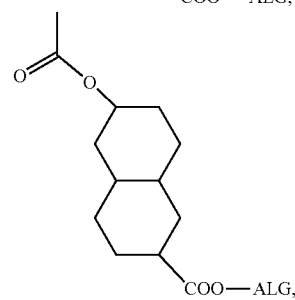

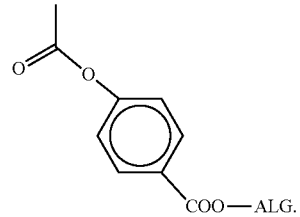

Another embodiment of the disclosure is a composition including a base generator, and a polymer having pendant lactone groups. In an embodiment, the polymer includes pendant acid-labile groups. In an embodiment, the composition includes a thermal acid generator. In an embodiment, the polymer includes from 20 wt. % to 70 wt. % of the pendant acid-labile groups and pendant lactone groups based on a total weight of the polymer. In an embodiment, the composition includes a solvent. In an embodiment, the base generator is a thermal base generator. In an embodiment, the pendant lactone groups are 5 or 6 member rings. In an embodiment, the pendant lactone groups are selected from

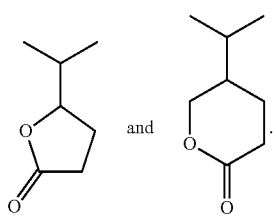

Another embodiment of the disclosure is a composition, including: a thermal acid generator; and a polymer having pendant acid-labile groups and pendant carboxylic acid groups. 5% to 20% of the total number of pendant acid-labile groups and pendant carboxylic acid groups are carboxylic acid groups. In an embodiment, the polymer comprises from 20 wt. % to 70 wt. % of the pendant acid-labile groups and carboxylic acid groups based on a total weight of the polymer. In an embodiment, the composition includes a solvent.

The foregoing outlines features of several embodiments or examples so that those skilled in the art may better

What is claimed is:

1. A method of manufacturing a semiconductor device, comprising:
   forming a first protective layer over an upper surface and side surfaces of a substrate;
   removing the first protective layer from the upper surface of the substrate while retaining a remaining portion of the first protective layer on a periphery of the substrate;
   curing the remaining portion of the first protective layer;
   forming a metal-containing photoresist layer over the upper surface of the substrate and the remaining portion of the first protective layer;
   removing the remaining portion of the first protective layer while retaining the metal-containing photoresist layer on a central portion of the upper surface of the substrate;
   selectively exposing the retained metal-containing photoresist layer to radiation;
   developing the selectively exposed metal-containing photoresist layer to form a pattern in the metal-containing photoresist layer,
   wherein the first protective layer is made of a composition comprising:
   an acid generator; and
   a polymer having pendant acid-labile groups, wherein the acid-labile groups include one or more polar switch functional groups selected from the group consisting of

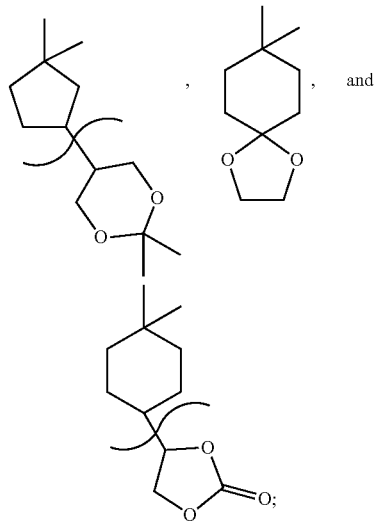

a polymer having pendant acid-labile groups, wherein greater than 5% of the pendant acid-labile groups have a structure

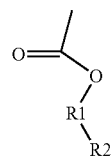

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alkyl carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alkyl carboxyl group, or C4-C9 cycloalkyl carboxyl group;

a polymer having pendant acid-labile groups and lactone pendant groups, wherein the lactone pendant groups are selected from

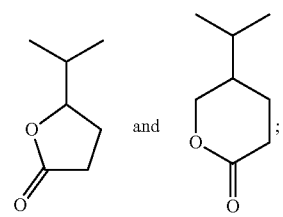

or a polymer having pendant acid-labile groups and pendant carboxylic acid groups, wherein the pendant acid-labile group is selected from the group consisting of

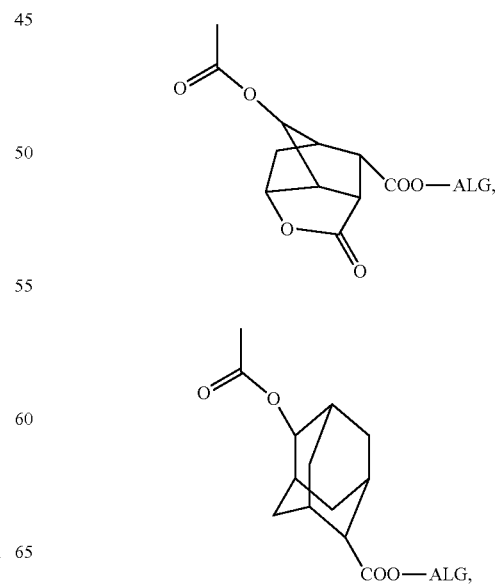

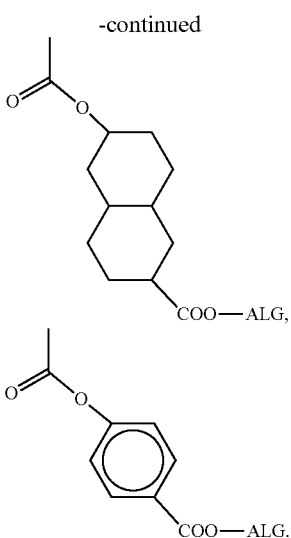

2. The method according to claim 1, wherein the acid generator is a thermal acid generator.

3. The method according to claim 1, wherein the curing the remaining portion of the first protective layer comprises a first heating of the remaining portion of the first protective layer at a temperature of 100° C. to 200° C. for 10 seconds to 5 minutes before forming the metal-containing photoresist layer.

4. The method according to claim 1, further comprising forming a second protective layer over an edge portion of the upper surface of the substrate after removing the remaining portion of the first protective layer and selectively exposing the metal-containing photoresist layer to radiation, wherein the edge portion of the upper surface of the substrate is adjacent to the selectively exposed metal-containing photoresist on the central portion of the upper surface of the substrate.

5. The method according to claim 4, wherein the second protective layer is made of a composition comprising:
a thermal acid generator; and
a polymer having pendant acid-labile groups, wherein the pendant acid-labile groups include one or more polar functional groups;
a polymer having pendant acid-labile groups, wherein the pendant acid-labile groups include one or more polar switch functional groups;
a polymer having pendant acid-labile groups, wherein greater than 5% of the pendant acid-labile groups have a structure

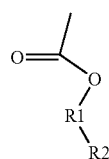

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alky carboxyl group, C6-C30 cycloalkyl carboxyl group, C6-C30 saturated or unsaturated hydrocarbon ring, or C6-C30 heterocyclic group;

and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alky carboxyl group, or C4-C9 cycloalkyl carboxyl group;
a polymer having pendant acid-labile groups and lactone pendant groups; or
a polymer having pendant acid-labile groups and pendant carboxylic acid groups.

6. The method according to claim 5, further comprising a second heating of the selectively exposed metal-containing photoresist layer and the second protective layer at a temperature of 100° C. to 200° C. for 10 seconds to 5 minutes.

7. The method according to claim 5, further comprising removing the second protective layer from over the edge portion of the upper surface of the substrate after the developing the selectively exposed metal-containing photoresist layer.

8. The method according to claim 1, further comprising a third heating of the remaining portion of the first protective layer and the metal-containing photoresist layer at a temperature in a range from 40° C. to 120° C. for about 10 seconds to about 10 minutes before removing the remaining portion of the first protective layer.

9. The method of claim 1, further comprising etching the substrate while the patterned metal-containing photoresist layer is disposed on the substrate.

10. A method of manufacturing a semiconductor device, comprising:
forming a first protective layer over an edge portion of a first main surface of a semiconductor substrate;
forming a photoresist layer over a central portion the first main surface of the semiconductor substrate adjacent to the edge portion of the first main surface;
removing the first protective layer from the edge portion of the first main surface while retaining the photoresist layer over the central portion of the first main surface;
selectively exposing the retained photoresist layer to actinic radiation,
wherein the first protective layer is made of a composition comprising:
an acid generator; and
a polymer having pendant acid-labile groups, wherein the acid-labile groups include one or more polar switch functional groups selected from the group consisting of

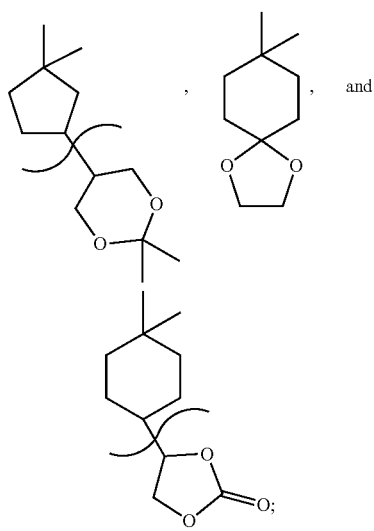

a polymer having pendant acid-labile groups, wherein greater than 5% of the pendant acid-labile groups have a structure

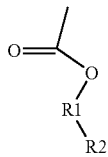

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alkyl carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alkyl carboxyl group, or C4-C9 cycloalkyl carboxyl group;

a polymer having pendant acid-labile groups and lactone pendant groups, wherein the lactone pendant groups are selected from

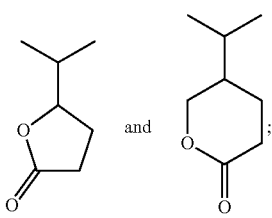

or a polymer having pendant acid-labile groups and pendant carboxylic acid groups, wherein the pendant acid-labile group is selected from the group consisting of

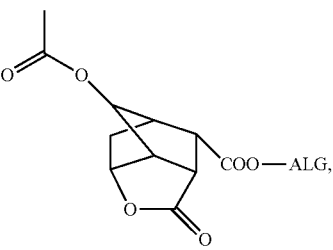

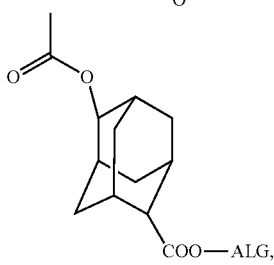

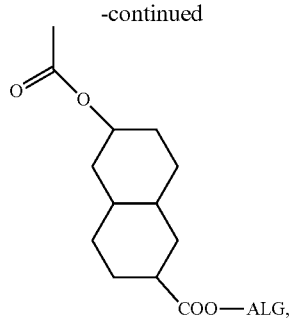

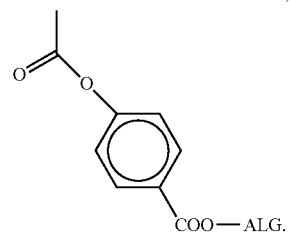

11. The method according to claim 10, wherein the acid generator is a thermal acid generator.

12. The method according to claim 10, further comprising heating the first protective layer at a temperature of 100° C. to 200° C. for 10 seconds to 5 minutes before forming the photoresist layer.

13. The method according to claim 10, further comprising forming a second protective layer over the edge portion of the first main surface of the semiconductor substrate after removing the first protective layer from the edge portion of the first main surface and selectively exposing the retained photoresist layer to actinic radiation on the central portion of the first main surface.

14. The method according to claim 13, wherein the second protective layer is made of a composition comprising:
a thermal acid generator; and
a polymer having pendant acid-labile groups, wherein the pendant acid-labile groups include one or more polar functional groups;
a polymer having pendant acid-labile groups, wherein the pendant acid-labile groups include one or more polar switch functional groups;
a polymer having pendant acid-labile groups, wherein greater than 5% of the pendant acid-labile groups have a structure

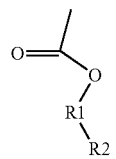

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alky carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alky carboxyl group, or C4-C9 cycloalkyl carboxyl group;

a polymer having pendant acid-labile groups and lactone pendant groups; or a polymer having pendant acid-labile groups and pendant carboxylic acid groups.

15. The method according to claim 13, further comprising a second heating of the selectively exposed photoresist layer and the second protective layer at a temperature of 100° C. to 200° C. for 10 seconds to 5 minutes.

16. The method according to claim 13, further comprising developing the selectively exposed photoresist layer to form a patterned photoresist layer.

17. The method according to claim 16, further comprising removing the second protective layer after the developing the selectively exposed photoresist layer.

18. A method of manufacturing a semiconductor device, comprising:

forming a protective layer on and around a periphery of a substrate;

curing the protective layer;

forming a metal-containing photoresist layer on a central region of the substrate;

selectively removing the protective layer from on and around the periphery of the substrate while retaining at least a part of the photoresist layer on the central region of the substrate;

selectively exposing to radiation the photoresist layer retained on the central region of substrate; and developing the exposed photoresist layer to form a pattern in the photoresist layer, wherein the protective layer comprises a composition including an acid generator and a polymer selected from a first polymer, a second polymer, a third polymer, a fourth polymer, and a fifth polymer, the first polymer comprising one or more pendant acid-labile groups including a polar functional group, the second polymer including one or more pendant groups selected from an acetal group, an acetonide group, and an anhydride group, the third polymer comprising one or more pendant acid-labile groups having the following structure:

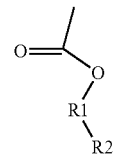

wherein R1 is a C6-C30 alkyl group, C6-C30 cycloalkyl group, C6-C30 hydroxylalkyl group, C6-C30 alkoxy group, C6-C30 alkoxyl alkyl group, C6-C30 acetyl group, C6-C30 acetylalkyl group, C6-C30 carboxyl group, C6-C30 alkyl carboxyl group, C6-C30 cycloalkyl carboxyl group, C6-C30 saturated or unsaturated hydrocarbon ring, or C6-C30 heterocyclic group; and R2 is C4-C9 alkyl group, C4-C9 cycloalkyl group, C4-C9 hydroxylalkyl group, C4-C9 alkoxy group, C4-C9 alkoxyl alkyl group, C4-C9 acetyl group, C4-C9 acetylalkyl group, C4-C9 carboxyl group, C4-C9 alkyl carboxyl group, or C4-C9 cycloalkyl carboxyl group, the fourth polymer comprising a pendant acid-labile group and a pendant lactone group, and the fifth polymer comprising a pendant acid-labile group and a pendant carboxylic acid group.

19. The method of claim 18, wherein the composition includes the polymer selected from the first polymer, the second polymer, the fourth polymer, and the fifth polymer.

20. The method of claim 18, wherein the composition includes the polymer selected from the second polymer and the fourth polymer.

* * * * *